United States Patent
Iwasa et al.

(10) Patent No.: US 11,677,050 B2
(45) Date of Patent: Jun. 13, 2023

(54) LIGHT EMITTING DEVICE EMITTING LIGHT BRIGHT IN BOTH SCOTOPIC VISION AND PHOTIPIC VISION

(71) Applicant: NICHIA CORPORATION, Anan (JP)

(72) Inventors: Makiko Iwasa, Anan (JP); Kazuya Nishimata, Anan (JP); Atsushi Yoshinari, Tokushima (JP); Shoji Hosokawa, Tokushima (JP); Masato Okawa, Anan (JP); Yasuaki Mashima, Tokushima (JP)

(73) Assignee: NICHIA CORPORATION, Anan (JP)

( * ) Notice: Subject to any disclaimer, the term of this patent is extended or adjusted under 35 U.S.C. 154(b) by 54 days.

(21) Appl. No.: 17/303,376

(22) Filed: May 27, 2021

(65) Prior Publication Data

US 2021/0376201 A1    Dec. 2, 2021

(30) Foreign Application Priority Data

May 29, 2020  (JP) .............................. JP2020-094898
May 18, 2021  (JP) .............................. JP2021-083880

(51) Int. Cl.
*H01L 33/50* (2010.01)
*F21K 9/64* (2016.01)
(Continued)

(52) U.S. Cl.
CPC ...... *H01L 33/504* (2013.01); *C09K 11/77212* (2021.01); *C09K 11/77348* (2021.01);
(Continued)

(58) Field of Classification Search
CPC ............... H01L 33/504; H01L 51/502; C09K 11/77212; C09K 11/77348; F21K 9/64; F21Y 2115/10
See application file for complete search history.

(56) References Cited

U.S. PATENT DOCUMENTS 9,219,201 B1 * 12/2015 Todorov ................. H01L 33/54
10,161,572 B2 * 12/2018 Rooijmans ............... F21K 9/60
(Continued)

FOREIGN PATENT DOCUMENTS

JP      2005008844 A      1/2005
JP      2010062272 A      3/2010
(Continued)

*Primary Examiner* — Tracie Y Green
(74) *Attorney, Agent, or Firm* — Hunton Andrews Kurth LLP

(57) ABSTRACT

A light emitting device includes a light emitting element having a dominant wavelength in a range of 400 nm or more and 500 nm or less, and a wavelength conversion member that is arranged on a light emitting side of the light emitting element and includes a rare earth aluminate fluorescent material having a composition represented by the following formula (I), wherein the light emitting device emits light having a dominant wavelength in a range of 475 nm or more and 500 nm or less, and wherein the light emitting device emits light having an S/P ratio of 6.5 or less derived from the formula (1), which is the ratio of a luminous flux in scotopic vision relative to a luminous flux in photopic vision:

$$(Lu_{1-p-n}Ln_pCe_n)_3(Al_{1-m}Ga_m)_{5k}O_{12} \quad (I)$$

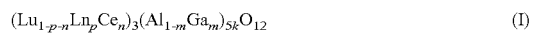

wherein in the formula (I), Ln represents at least one rare earth element selected from the group consisting of Y, La, Gd, and Tb, and the parameters k, m, n, and p satisfy $0.95 \leq k \leq 1.05$, $0.05 \leq m \leq 0.70$, $0.002 \leq n \leq 0.050$, and $0 \leq p \leq 0.30$, respectively.

14 Claims, 9 Drawing Sheets

(51) Int. Cl.
*C09K 11/77* (2006.01)
*F21Y 115/10* (2016.01)
*H01L 33/62* (2010.01)
*H01L 51/50* (2006.01)

(52) U.S. Cl.
CPC ............. *F21K 9/64* (2016.08); *F21Y 2115/10* (2016.08); *H01L 33/62* (2013.01); *H01L 51/502* (2013.01)

(56) References Cited

U.S. PATENT DOCUMENTS

| | | |
|---|---|---|
| 10,658,552 B2 | 5/2020 | Bechtel et al. |
| 2011/0210354 A1 | 9/2011 | Ichikawa et al. |
| 2014/0084320 A1 | 3/2014 | Ichikawa et al. |
| 2014/0131753 A1 | 5/2014 | Ishida et al. |
| 2015/0131259 A1* | 5/2015 | Ouderkirk ................ F21K 9/64 362/84 |
| 2015/0228868 A1* | 8/2015 | Ouderkirck ............... F21V 7/00 362/84 |
| 2015/0340577 A1 | 11/2015 | Ishida et al. |
| 2016/0049566 A1 | 2/2016 | Ichikawa et al. |
| 2016/0056357 A1 | 2/2016 | Ichikawa et al. |
| 2017/0141273 A1 | 5/2017 | Ichikawa et al. |
| 2017/0186920 A1 | 6/2017 | Kumano et al. |
| 2017/0352787 A1 | 12/2017 | Takei et al. |
| 2018/0244986 A1 | 8/2018 | Yanagihara et al. |
| 2018/0301600 A1 | 10/2018 | Ichikawa et al. |
| 2019/0035981 A1 | 1/2019 | Ichikawa et al. |
| 2019/0088825 A1 | 3/2019 | Ichikawa et al. |
| 2020/0287096 A1 | 9/2020 | Ichikawa et al. |

FOREIGN PATENT DOCUMENTS

| | | |
|---|---|---|
| JP | 2014112635 A | 6/2014 |
| JP | 2017117912 A | 6/2017 |
| JP | 2017220312 A | 12/2017 |
| JP | 2018172628 A | 11/2018 |

* cited by examiner

LIGHT EMITTING DEVICE EMITTING LIGHT BRIGHT IN BOTH SCOTOPIC VISION AND PHOTIPIC VISION

CROSS-REFERENCE TO RELATED PATENT APPLICATION

This application claims priority to Japanese Patent Application No. 2020-094898, filed on May 29, 2020, and Japanese Patent Application No. 2021-083880, filed on May 18, 2021, the disclosures of which are hereby incorporated reference in their entireties.

BACKGROUND

Technical Field

The present disclosure relates to a light emitting device.

Description of Related Art

As a light emitting device using a light emitting element such as a light emitting diode (LED), there is known a light emitting device using a blue light emitting element and a fluorescent material that is excited by the light emitted from the light emitting element for light emission, thereby emitting a mixed light. Such a light emitting device is utilized in a wide variety of fields such as general illumination devices, in-vehicle lightings, displays, and backlights for liquid-crystal devices. In this specification, the "fluorescent material" is used in the same meaning as a "fluorescent phosphor".

As for such a light emitting device, a light emitting device in consideration of the influence on humans has been attracting attention in recent years. For example, it is known that when a human recognizes light, the visual sensitivity of the human eye varies in dark and bright places. In photopic vision that is in a bright environment, color can be perceived by the action of a cone cell, which is a photoreceptor cell (visual cell) of the human eye. In scotopic vision that is in a dark environment, many colors cannot be perceived since the cone cell does not function, but the visual sensitivity is improved by the action of a rod cell.

It is known that the peak wavelength of the visual sensitivity by the cone cell actively acting in a bright place is 555 nm, the peak wavelength of the visual sensitivity by the rod cell actively acting in a dark place is 507 nm, and the peak of the visual sensitivity is different in a dark place and a bright place. Such a phenomenon is known as the Purkinje Phenomenon in which the color on the long wavelength side is vividly seen in a bright place and the color on the short wavelength side is vividly seen in a dark place.

For example, as a lighting device utilizing the Purkinje Phenomenon, Japanese Unexamined Patent Publication No. 2017-220312 proposes a street lamp emitting white light and capable of providing high footway visibility to drivers and providing high visibility to pedestrians with less perception of color unevenness between the roadway side and the footway side in a mesopic environment with a brightness between dark and bright. Japanese Unexamined Patent Publication No. 2017-220312 also states that the higher the S/P ratio, which is the ratio of scotopic vision to photopic vision, the higher the visibility of light in a mesopic environment.

However, when the S/P ratio is too high, the light may be perceived as dark in photopic vision and bright in scotopic vision by the human eye. Also, the light emitting device may be required to emit a light emitting color capable of notifying a specific state such as charging of a portable device, and it is necessary to consider an influence of such light emission of the light emitting device on humans.

Accordingly, an embodiment of the present disclosure has an object to provide a light emitting device which is bright in both scotopic vision and photopic vision, emits a light emitting color capable of reminding a specific state image, and takes into consideration of an influence on humans.

SUMMARY

An embodiment of the present disclosure is a light emitting device including a light emitting element having a dominant wavelength in a range of 400 nm or more and 500 nm or less, and a wavelength conversion member that is arranged on a light emitting side of the light emitting element and includes a rare earth aluminate fluorescent material having a composition represented by the following formula (I):

$$(Lu_{1-p-n}Ln_{p}Ce_{n})_{3}(Al_{1-m}Ga_{m})_{5k}O_{12} \quad (I)$$

wherein in the formula (I), Ln represents at least one rare earth element selected from the group consisting of Y, La, Gd, and Tb, and the parameters k, m, n, and p satisfy $0.95 \leq k \leq 1.05$, $0.05 \leq m \leq 0.70$, $0.002 \leq n \leq 0.050$, and $0 \leq p \leq 0.30$, respectively, wherein the light emitting device emits light having a dominant wavelength in a range of 475 nm or more and 500 nm or less, and wherein the light emitting device emits light having an S/P ratio of 6.5 or less derived from the following formula (1), which is the ratio of a luminous flux in scotopic vision relative to a luminous flux in photopic vision:

$$S/P \text{ ratio} = \frac{K' \int_{360}^{830} V'(\lambda)\phi_{e}(\lambda)d\lambda}{K \int_{360}^{830} V(\lambda)\phi_{e}(\lambda)d\lambda} \quad (1)$$

wherein in the formula (1), the constant K is 6,831 (lm/W), the constant K' is 1,700 (lm/W), and in a range where the wavelength λ is 360 nm or more and 830 nm or less, V(λ) refers to a photopic standard spectral luminous efficiency of humans, V'(λ) refers to a scotopic standard spectral luminous efficiency of humans, and $\Phi_{e}(\lambda)$ refers to a spectral total radiant flux of the light emitted from the light emitting device.

Another embodiment of the present disclosure is a light emitting device including a light emitting element having a dominant wavelength in a range of 400 nm or more and 500 nm or less, and a wavelength conversion member that is arranged on a light emitting side of the light emitting element and includes a rare earth aluminate fluorescent material having a composition represented by the following formula (I):

$$(Lu_{1-p-n}Ln_{p}Ce_{n})_{3}(Al_{1-m}Ga_{m})_{5k}O_{12} \quad (I)$$

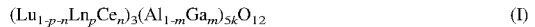

wherein in the formula (I), Ln represents at least one rare earth element selected from the group consisting of Y, La, Gd, and Tb, and the parameters k, m, n, and p satisfy $0.95 \leq k \leq 1.05$, $0.05 \leq m \leq 0.70$, $0.002 \leq n \leq 0.050$, and $0 \leq p \leq 0.30$, respectively, wherein the light emitting device emits light having a dominant wavelength in a range of 475 nm or more and 500 nm or less, and wherein the light emitting device emits light a melanopic ratio of 3.4 or less derived from the following formula (2):

$$\text{Melanopic ratio} = \frac{\int_{380}^{730} \text{Lamp} \times \text{Circadian}}{\int_{380}^{730} \text{Lamp} \times \text{Visual}} \times 1.218 \qquad (2)$$

wherein in the formula (2), in a range where the wavelength is 380 nm or more and 730 nm or less, "Lamp" refers to a spectral distribution of the light emitting device, "Circadian" refers to a sensitivity curve of an intrinsically photosensitive retinal ganglion cell that is a photoreceptor in the mammalian retina, "Visual" refers to a visual sensitivity curve in human photopic vision, "Lamp×Circadian" refers to a circadian response included in the spectral distribution of the light emitting device, "Lamp×Visual" refers to a visual sensitivity response included in the spectral distribution of the light emitting device, and "1.218" is a constant (lux factor).

In accordance with the embodiments of the present disclosure, it is possible to provide a light emitting device which is bright in both scotopic vision and photopic vision, emits a light emitting color capable of reminding a specific state image such as charging, and takes into consideration of an influence on humans.

DETAILED DESCRIPTION

The light emitting device according to the present disclosure will be hereunder described on the basis of embodiments. The embodiments described below are exemplifications for embodying the technical idea of the present disclosure, and the present disclosure is not limited to the following light emitting device. The relationships between color names and chromaticity coordinates, and the relationships between wavelength ranges of light and color names of monochromic light are in accordance with Japanese Industrial Standard (JIS) Z8110. In the case where a plurality of substances corresponding to each component are present in a composition, the content of each component in the composition means the total amount of the plurality of substances present in the composition, unless otherwise specified.

Light Emitting Device

The light emitting device of the embodiment is a light emitting device including a light emitting element having a dominant wavelength in a range of 400 nm or more and 500 nm or less, and a wavelength conversion member that is arranged on a light emitting side of the light emitting element including and includes a rare earth aluminate fluorescent material having a composition represented by the formula (I) described later, wherein the light emitting device emits light having a dominant wavelength in a range of 475 nm or more and 500 nm or less, and wherein the light emitting device emits light having an S/P ratio of 6.5 or less derived from the formula (l) described later, which is the ratio of a luminous flux in scotopic vision relative to a luminous flux in photopic vision.

The dominant wavelength of the light emitting element refers to a wavelength of the point where the chromaticity coordinates (x=0.3333, y=0.3333) of white light and the chromaticity coordinates $(x_E, y_E)$ of the light emission color of the light emitting element in the Commission Internationale de l'Eclairage (CIE) 1931 chromaticity diagram defined by the CIE are connected by a straight line, and the extension line and the spectrum locus intersect. The spectrum locus refers to a curve obtained by connecting chromaticity points of monochromatic (pure) light on the chromaticity diagram. The dominant wavelength of the light emitting device refers to a wavelength of the point where the chromaticity coordinates (x=0.3333, y=0.3333) of white light and the chromaticity coordinates (x, y) of the light emission color of the light emitting device in the CIE 1931 chromaticity diagram are connected by a straight line, and the extension line and the spectrum locus intersect.

Figure 1:
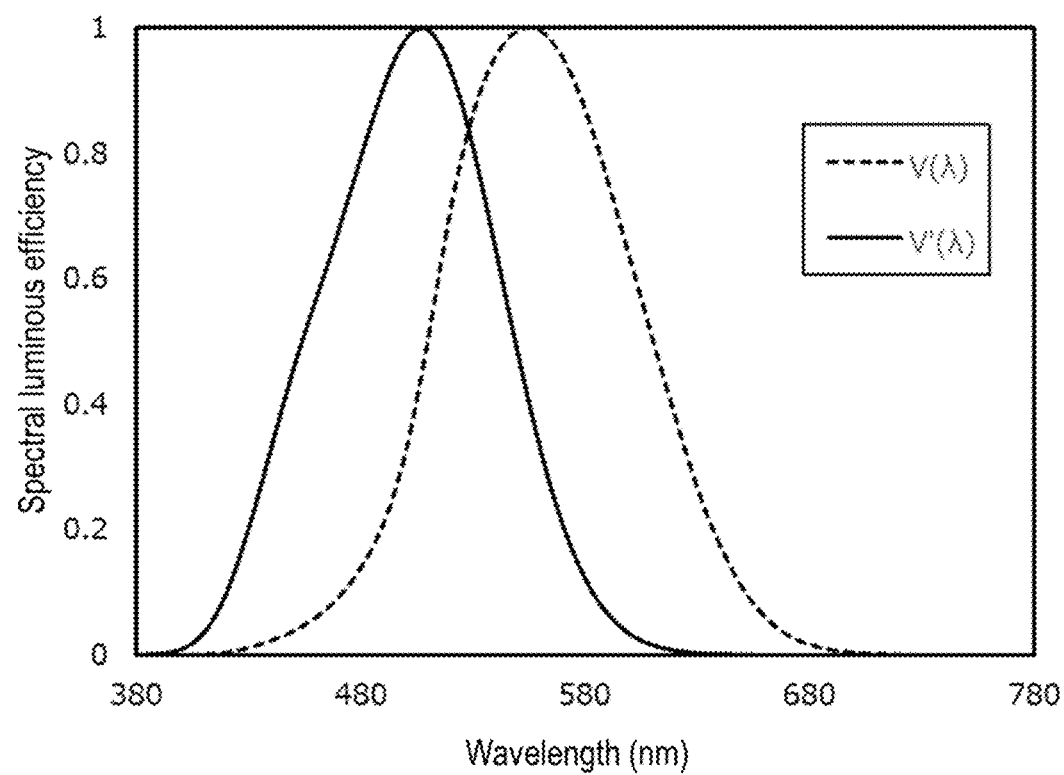
FIG. 1 is an exemplary graph showing a photopic standard spectral luminous efficiency V(λ) and a scotopic standard spectral luminous efficiency V'(λ).

The light emitting device includes a light emitting element having a dominant wavelength in the wavelength range from blue to bluish-green and a fluorescent material having a light emission peak wavelength in the wavelength range of green, and emits light having a dominant wavelength in the wavelength range from blue to green including bluish-green. It is known that the higher the S/P ratio, which is the ratio of a luminous flux in scotopic vision to a luminous flux in photopic vision, the higher the human visibility. FIG. 1 is a graph showing a photopic standard spectral luminous efficiency V(λ) and a scotopic standard spectral luminous efficiency V'(λ). The photopic standard spectral luminous efficiency V(λ) and the scotopic standard spectral luminous efficiency V'(λ) are defined by the CIE. As shown in FIG. 1, the peak wavelength in the photopic standard spectral luminous efficiency V(λ) is 555 nm, the peak wavelength in the scotopic standard spectral luminous efficiency V'(λ) is 507 nm, and the peak of the visual sensitivity is different in a dark place and a bright place. It is known that, since the peak wavelength of the visual sensitivity of the human eye is different in a dark place and a bright place, the color on the long wavelength side is vividly seen in a bright place and the color on the short wavelength side is vividly seen in a dark place by the Purkinje Phenomenon. In the case where the S/P ratio of the light emitting device that emits light having a dominant wavelength in the wavelength range from purple to green is increased for improving the visibility, the light may be perceived as too bright when viewed in a dark place since the color on the short wavelength side becomes too vivid. The light emitting device according to the embodiment of the present disclosure has an S/P ratio of 6.5 or less even when emitting light having a dominant wavelength in the wavelength range from blue to green including bluish-green. It is thus considered that the difference between the luminous flux in a dark place and the luminous flux in a bright place can be reduced, the light can be brightly seen in both scotopic vision and photopic vision, and excellent visibility can be maintained.

The S/P ratio, which is the ratio of a luminous flux in a dark place to a luminous flux in a bright place, can be derived from the following formula (1):

$$S/P \text{ ratio} = \frac{K' \int_{360}^{830} V'(\lambda)\phi_e(\lambda)d\lambda}{K \int_{360}^{830} V(\lambda)\phi_e(\lambda)d\lambda} \quad (1)$$

wherein in the formula (1), the constant K is 6,831 (lm/W), the constant K' is 1,700 (lm/W), and in a range where the wavelength $\lambda$ is 360 nm or more and 830 nm or less, $V(\lambda)$ refers to a photopic standard spectral luminous efficiency of humans, $V'(\lambda)$ refers to a scotopic standard spectral luminous efficiency of humans, and $\Phi_e(\lambda)$ refers to a spectral total radiant flux of the light emitted from the light emitting device.

The S/P ratio, which is the ratio of a luminous flux in scotopic vision to a luminous flux in photopic vision of light emitted from the light emitting device, is 6.5 or less, preferably 6.0 or less, preferably 2.0 or more, and more preferably 3.0 or more. It is considered that, by setting the S/P ratio of light emitted from the light emitting device to 6.5 or less and reducing the difference between the luminous flux in scotopic vision and the luminous flux in photopic vision, the light emitting device emitting light having a dominant wavelength in the wavelength range from blue to green including bluish-green is also able to emit light which is bright in both scotopic vision and photopic vision while maintaining excellent visibility, in which the difference in brightness perceived by humans is reduced in both scotopic vision and photopic vision. The dominant wavelength of the light emitted from the light emitting device or the light emitting element, the luminous flux, the chromaticity coordinates (x, y) in the xy chromaticity coordinate system of the CIE 1931 chromaticity diagram described later, and the spectral total radiant flux of the light emitted from the light emitting device can be measured using an optical measurement system that combines a spectrophotometer (for example, PMA-11, manufactured by Hamamatsu Photonics K.K.) and an integral sphere.

The light emitting device of the another embodiment is a light emitting device including a light emitting element having a dominant wavelength in a range of 400 nm or more and 500 nm or less, and a wavelength conversion member that is arranged on a light emitting side of the light emitting element and includes a rare earth aluminate fluorescent material having a composition represented by the formula (I) described later, wherein the light emitting device emits light having a dominant wavelength in a range of 475 nm or more and 500 nm or less, and wherein the light emitting device emits light having a melanopic ratio of 3.4 or less derived from the following formula (2):

$$\text{Melanopic ratio} = \frac{\int_{380}^{730} \text{Lamp} \times \text{Circadian}}{\int_{380}^{730} \text{Lamp} \times \text{Visual}} \times 1.218 \quad (2)$$

wherein in the formula (2), in the range where the wavelength is 380 nm or more and 730 nm or less, "Lamp" refers to a spectral distribution of the light emitting device, "Circadian" refers to a sensitivity curve of an intrinsically photosensitive retinal ganglion cell (ipRGC) that is a photoreceptor in the mammalian retina, "Visual" refers to a visual sensitivity curve in human photopic vision, "Lamp× Circadian" refers to a circadian response included in the spectral distribution of the light emitting device, "Lamp× Visual" refers to a visual sensitivity response included in the spectral distribution of the light emitting device, and "1.218" is a constant (lux factor). The spectral distribution (light emission spectrum) of the light emitting device can be measured using an optical measurement system that combines a spectrophotometer (for example, PMA-11, manufactured by Hamamatsu Photonics K.K.) and an integral sphere. The "Visual" can use the human photopic standard spectral luminous efficiency $V(\lambda)$ defined by the CIE (Visual=$V(\lambda)$).

Figure 2:
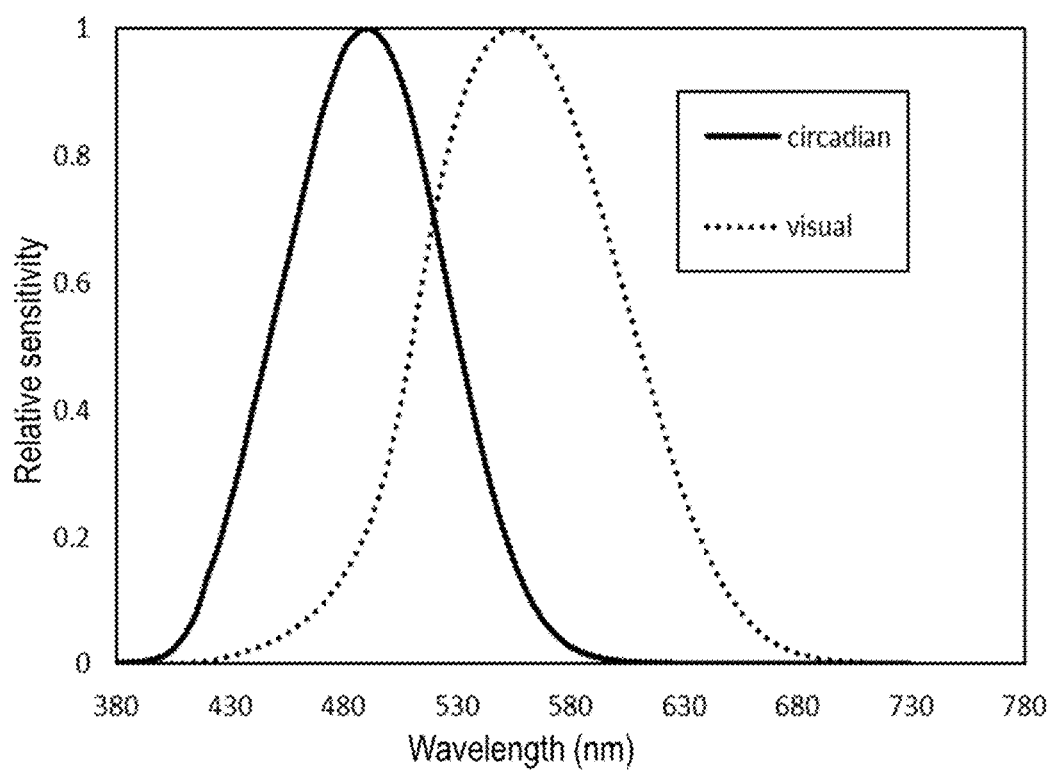
FIG. 2 is an exemplary graph showing a sensitivity curve (Circadian) of an intrinsically photosensitive retinal ganglion cell that is a photoreceptor in the mammalian retina and a visual sensitivity curve (Visual) in human photopic vision.

In addition to the cone cell and the rod cell, the presence of an intrinsically photosensitive retinal ganglion cell (ipRGC) containing melanopsin which is a visual substance has been found in the photoreceptor cell (visual cell) of the human retina. The ipRGC indicates a neural response to photic stimulation even in a single body, also indicates a neural response to photic stimulation upon receiving input from the cone and rod cells, and affects circadian rhythm of the human. FIG. 2 is a graph showing a sensitivity curve (Circadian action curve) of the ipRGC and a visual sensitivity curve (Visual) of human photopic vision. The peak wavelength in the visual sensitivity curve of human photopic vision is 555 nm, and melanopsin output from the ipRGC has a peak wavelength of its sensitivity in the vicinity of 480 nm to 500 nm. Melanopsin is also involved in secretion and suppression of melatonin, which is a sleep-promoting hormone. Further, the output of melanopsin possessed by the ipRGC is also projected to the visual field imaging system path from the lateral geniculate body transmitting visual information, which may affect the visual system such as image perception. For example, the melanopic ratio is a numerical value derived from the spectral distribution of the light emitting device, the sensitivity curve (absorbance) of the ipRGC, and the visual sensitivity curve in human photopic vision. The higher the melanopic ratio, the more stimulation is given to the circadian rhythm of human. It is considered that, when the melanopic ratio of light emitted from the light emitting device is 3.4 or less, a specific behavior can be reminded by a signal color representing a specific state of the apparatus such as charging without significantly affecting the circadian rhythm of human.

The melanopic ratio of light emitted from the light emitting device may be 3.3 or less, may be 3.2 or less, preferably 1.4 or more, and more preferably 1.5 or more. When the melanopic ratio of light emitted from the light emitting device falls within the range of 1.4 or more and 3.4 or less, a specific behavior can be reminded by light that emits a signal color representing a specific state such as charging without significantly affecting the circadian rhythm of human.

Figure 3:
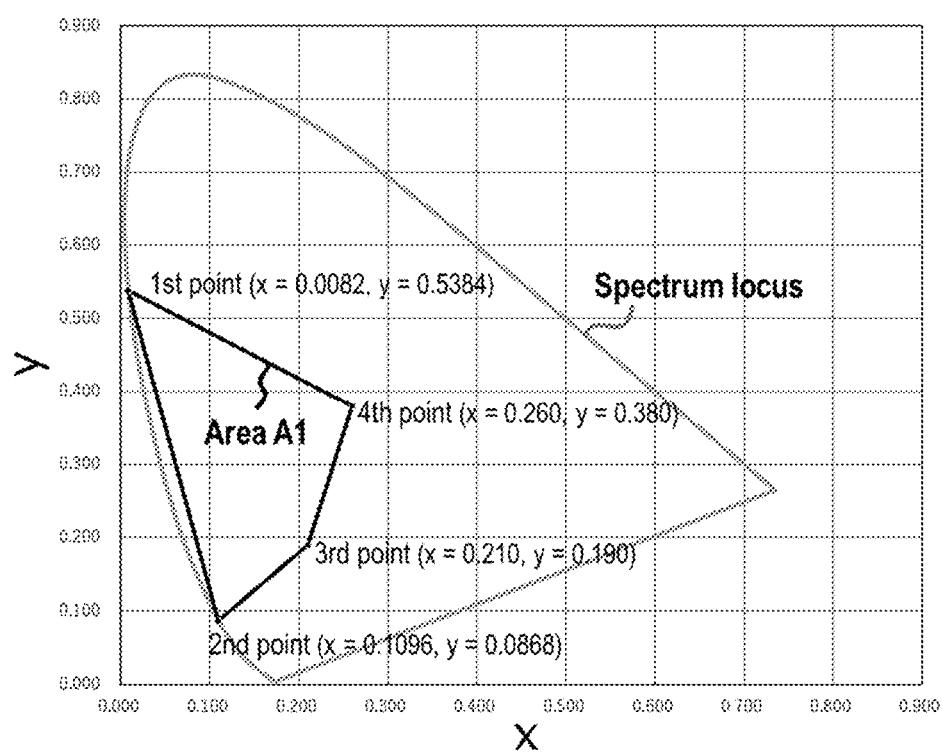
FIG. 3 is an exemplary diagram showing an area A1 in the xy chromaticity coordinate system of the CIE 1931 chromaticity diagram.

The light emitting device preferably emits light having chromaticity coordinates (x, y) within an area A1 in the xy chromaticity coordinate system of the CIE 1931 chromaticity diagram, wherein when the chromaticity coordinates (x=0.0082, y=0.5384) is defined as a first point, the chromaticity coordinates (x=0.1096, y=0.0868) is defined as a second point, the chromaticity coordinates (x=0.210, y=0.190) is defined as a third point, and the chromaticity coordinates (x=0.260, y=0.380) is defined as a fourth point, the area A1 is demarcated by a first straight line connecting the first point and the second point, a second straight line connecting the second point and the third point, a third straight line connecting the third point and the fourth point, and a fourth straight line connecting the fourth point and the first point. FIG. 3 shows the area A1 in the xy chromaticity coordinate system of the CIE 1931 chromaticity diagram. The light emitting device preferably emits light in the area A1 surrounded by straight lines connecting the first and second points, the second and third points, the third and fourth points, and the fourth and first points shown in FIG. 3. The light emitting device emits light in the area A1 shown in FIG. 3; and the light in the area A1 has a dominant wavelength in a range of 475 nm or more and 500 nm or less, and exhibits a light emission color from blue to green including bluish-green.

Figure 4:
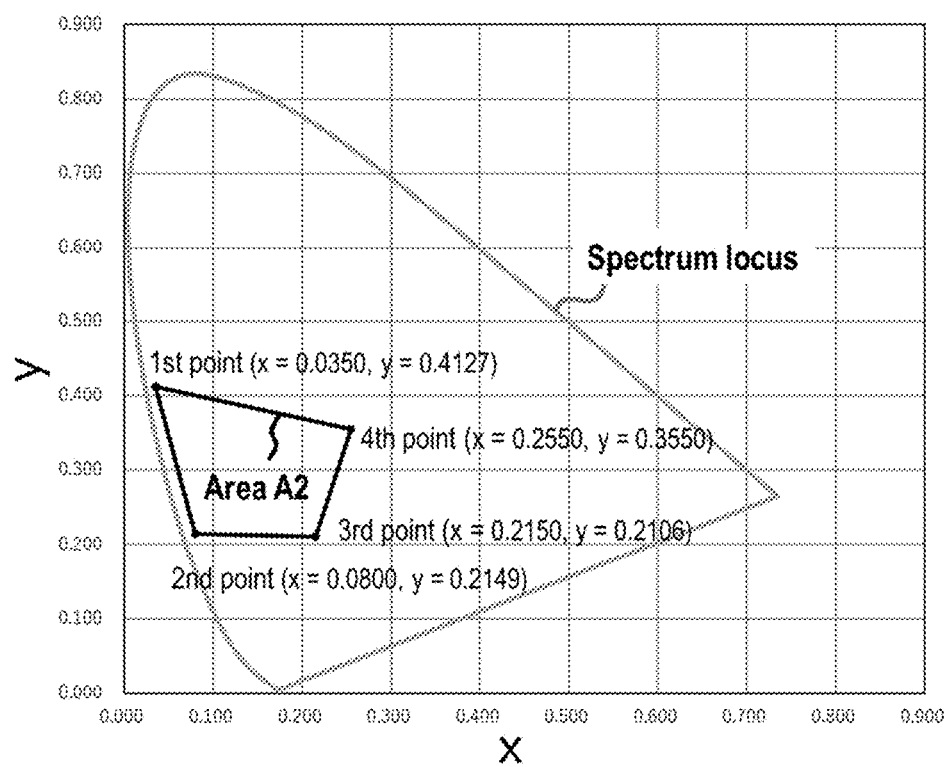
FIG. 4 is an exemplary diagram showing an area A2 in the xy chromaticity coordinate system of the CIE 1931 chromaticity diagram.

The light emitting device preferably emits light having chromaticity coordinates (x, y) within an area A2 in the xy chromaticity coordinate system of the CIE 1931 chromaticity diagram, wherein when the chromaticity coordinates (x=0.0350, y=0.4127) is defined as a first point, the chromaticity coordinates (x=0.0800, y=0.2149) is defined as a second point, the chromaticity coordinates (x=0.2150, y=0.2106) is defined as a third point, and the chromaticity coordinates (x=0.2550, y=0.3550) is defined as a fourth point, the area A2 is demarcated by a first straight line connecting the first point and the second point, a second straight line connecting the second point and the third point, a third straight line connecting the third point and the fourth point, and a fourth straight line connecting the fourth point and the first point. FIG. 4 shows the area A2 in the xy chromaticity coordinate system of the CIE 1931 chromaticity diagram. The light emitting device preferably emits light in the area A2 surrounded by straight lines connecting the first and second points, the second and third points, the third and fourth points, and the fourth and first points shown in FIG. 4. The light emitting device emits light in the area A2 shown in FIG. 4; and the light in the area A2 has a dominant wavelength in a range of 475 nm or more and 500 nm or less, and exhibits a light emission color from blue to bluish-green.

Figure 5:
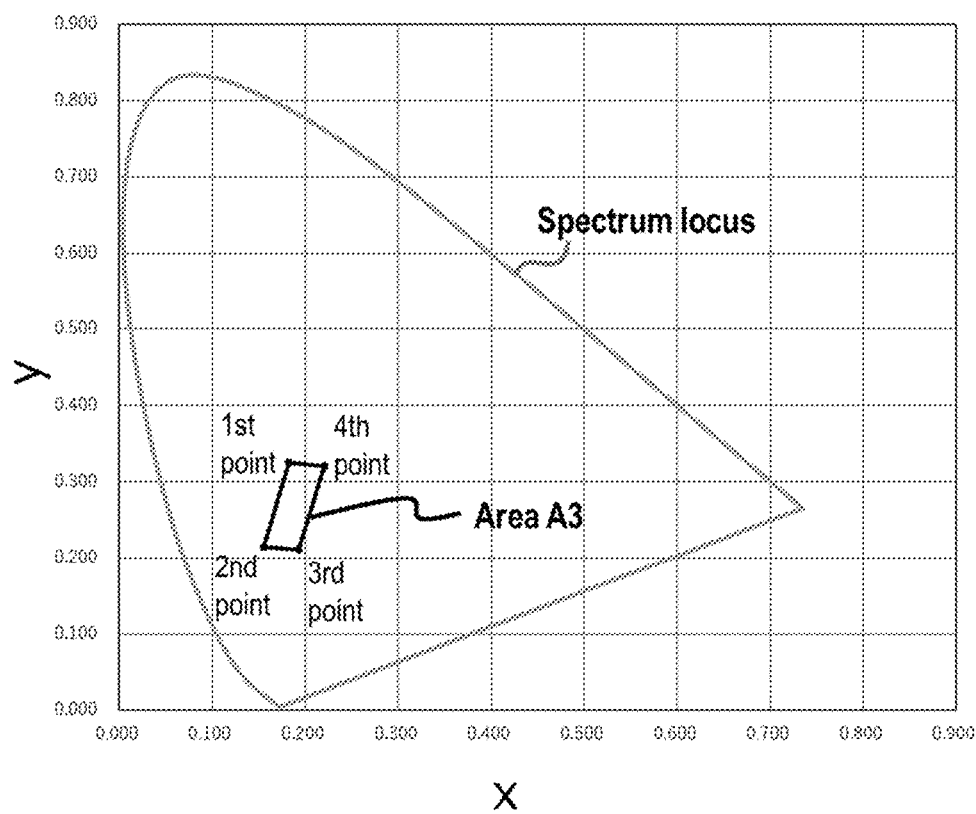
FIG. 5 is an exemplary diagram showing an area A3 in the xy chromaticity coordinate system of the CIE 1931 chromaticity diagram.

The light emitting device preferably emits light having chromaticity coordinates (x, y) within an area A3 in the xy chromaticity coordinate system of the CIE 1931 chromaticity diagram, wherein when the chromaticity coordinates (x=0.1825, y=0.3252) is defined as a first point, the chromaticity coordinates (x=0.1550, y=0.2149) is defined as a second point, the chromaticity coordinates (x=0.1930, y=0.2106) is defined as a third point, and the chromaticity coordinates (x=0.2205, y=0.3209) is defined as a fourth point, the area A3 is demarcated by a first straight line connecting the first point and the second point, a second straight line connecting the second point and the third point, a third straight line connecting the third point and the fourth point, and a fourth straight line connecting the fourth point and the first point. FIG. 5 shows the area A3 in the xy chromaticity coordinate system of the CIE 1931 chromaticity diagram. The light emitting device preferably emits light in the area A3 surrounded by straight lines connecting the first and second points, the second and third points, the third and fourth points, and the fourth and first points shown in FIG. 5. The light emitting device emits light in the area A3 shown in FIG. 5; and the light in the area A3 has a dominant wavelength in a range of 475 nm or more and 500 nm or less, and exhibits a light emission color from blue to bluish-green.

In a light emission spectrum of the light emitting device, the integrated value ratio Ib/Ia of the integrated value Ib in a wavelength range of 380 nm or more and 531 nm or less relative to the integrated value Ia in a wavelength range of 380 nm or more and 780 nm or less is preferably in a range of 0.6 or more and 0.95 or less, more preferably in a range of 0.65 or more and 0.94 or less, even more preferably in a range of 0.70 or more and 0.93 or less, and particularly preferably in a range of 0.75 or more and 0.92 or less. It is considered that, when the integrated value ratio Ib/Ia in the light emission spectrum of the light emitting device falls within the range of 0.6 or more and 0.95 or less, the light emitting device emits light having a dominant wavelength in a wavelength range from blue to green including bluish-green, and is able to emit light which is bright in both scotopic vision and photopic vision while maintaining excellent visibility, in which the difference in brightness perceived by humans is reduced in both scotopic vision and photopic vision. The light emission spectra of the light emitting device, the integrated value Ia in the wavelength range of 380 nm or more and 780 nm or less and the integrated value Ib in the wavelength range of 380 nm or more and 531 nm or less in the measured light emission spectra can be measured using an optical measurement system that combines a spectrophotometer (for example, PMA-11, manufactured by Hamamatsu Photonics K.K.) and an integral sphere. The integrated value ratio Ib/Ia can be determined from the measured integrated value Ia and the integrated value Ib.

Light Emitting Element

As the light emitting element, for example, a light emitting diode (LED) chip or a laser diode (LD) chip, which is a semiconductor light emitting element using a nitride-based semiconductor represented by a compositional formula of $In_XAl_YGa_{1-X-Y}N$ ($0 \leq X$, $0 \leq Y$, $X+Y \leq 1$), can be used, and an LED chip is preferably used.

The light emitting element has a dominant wavelength in a range of 400 nm or more and 500 nm or less. The dominant wavelength of light emitted from the light emitting element is preferably in a range of 420 nm or more and 495 nm or less, and more preferably in a range of 430 nm or more and 490 nm or less.

The light emitting element preferably has a light emission peak wavelength in a range of 380 nm or more and 500 nm or less, more preferably in a range of 390 nm or more and 495 nm or less, even more preferably in a range of 400 nm or more and 490 nm or less, and particularly preferably in a range of 420 nm or more and 490 nm or less.

The light emitting element is provided with a p-electrode and an n-electrode. The p-electrode and the n-electrode of the light emitting element may be formed on the same side surface as the light emitting element, or may be provided on different side surfaces. The light emitting element may be flip-chip mounted.

Rare Earth Aluminate Fluorescent Material

The rare earth aluminate fluorescent material contained in the light emitting device has a composition represented by the following formula (I):

$$(Lu_{1-p-n}Ln_pCe_n)_3(Al_{1-m}Ga_m)_{5k}O_{12} \quad (I)$$

wherein in the formula (I), Ln represents at least one rare earth element selected from the group consisting of Y, La, Gd, and Tb, and the parameters k, m, n, and p satisfy $0.95 \leq k \leq 1.05$, $0.05 \leq m \leq 0.70$, $0.002 \leq n \leq 0.050$, and $0 \leq p \leq 0.30$ respectively.

The rare earth aluminate fluorescent material having a composition represented by the formula (I) is excited by light emitted from a light emitting element having a dominant wavelength in a range of 400 nm or more and 500 nm or less to convert the wavelength of the light emitted from the light emitting element, and light having a dominant wavelength in a range of 475 nm or more and 500 nm or less is emitted from the light emitting device.

In the formula (I), the molar ratio of Ce is the product of the parameter n and 3. The parameter n is 0.002 or more, may be 0.003 or more, may be 0.004 or more, and may be 0.005 or more; and is 0.050 or less, may be 0.045 or less, may be 0.040 or less, may be 0.035 or less, and may be 0.030 or less. Ce acts as an activator of the rare earth aluminate fluorescent material. In the formula (I), the parameter n may be in a range of 0.002 or more and 0.045 or less ($0.002 \leq n \leq 0.045$), may be in a range of 0.002 or more and 0.040 or less ($0.002 \leq n \leq 0.040$), may be in a range of 0.003 or more and 0.040 or less ($0.003 \leq n \leq 0.040$), and may be in a range of 0.003 or more and 0.035 or less ($0.003 \leq n \leq 0.035$). The molar ratio of Ce in 1 mol of the rare earth aluminate fluorescent material having a composition represented by the formula (I) is preferably in a range of 0.006 or more and 0.15 or less. When the molar ratio of Ce falls within the range of 0.006 or more and 0.15 or less, high light emission luminance and a desired light emission color can be obtained.

In the formula (I), the molar ratio of Ga is the product of the parameter m, the parameter k in a range of 0.95 or more and 1.05 or less, and 5. The parameter m is in a range of 0.05 or more and 0.70 or less ($0.05 \leq m \leq 0.70$), may be in a range of 0.10 or more and 0.70 or less ($0.10 \leq m \leq 0.70$), and may be in a range of 0.10 or more and 0.60 or less ($0.10 \leq m \leq 0.60$). The parameter m may be 0.20 or more, may be 0.30 or more, may be 0.55 or less, and may be 0.50 or less. The molar ratio of Ga in 1 mol of the rare earth aluminate fluorescent material having a composition represented by the formula (I) is preferably in a range of 0.2375 or more and 3.15 or less. In the formula (I), the parameter m is adjusted to be in the range of 0.05 or more and 0.70 or less in the molar ratio of Ga represented by the product of the parameter k, the parameter m, and 5, together with Al, so that the light emission peak wavelength of the fluorescent material can be changed, and a desired light emission color can be obtained when used in the light emitting device.

In the formula (I), Ln represents at least one rare earth element selected from the group consisting of Y, La, Gd, and Tb. The rare earth element Ln acts as a co-activator together with Ce serving as an activator. The rare earth element Ln may be at least one rare earth element selected from the group consisting of Y, La, and Gd, and may be Y. In the formula (I), the molar ratio of the at least one rare earth element Ln selected from the group consisting of Y, La, Gd, and Tb is the product of the parameter p and 3. In the formula (I), the rare earth element Ln may not be contained. In the formula (I), the parameter p may be in a range of 0 or more and 0.20 or less ($0 \leq p \leq 0.20$). In the formula (I), the parameter p may be in a range of 0.001 or more and 0.20 or less ($0.001 \leq p \leq 0.20$).

In the formula (I), the parameters m, n, and p preferably satisfy $0.10 \leq m \leq 0.70$, $0.002 \leq n \leq 0.040$, and $0 \leq p \leq 0.20$ respectively. By adjusting the molar ratio of Ce acting as an activator, the molar ratio of Ga, and optionally the molar ratio of the rare earth element Ln, a desired light emission color can be obtained when used in the light emitting device.

Method for Producing Rare Earth Aluminate Fluorescent Material

The rare earth aluminate fluorescent material can be produced by using compounds of oxides containing each element of Lu, Ce, Al, Ga, and optionally the at least one rare earth element Ln selected from the group consisting of Y, La, Gd, and Tb, or compounds of carbonates or hydroxides to be oxides by thermal decomposition as raw materials, and heat-treating a raw material mixture of the compounds containing each element. The raw material mixture obtained by mixing only raw materials before heat treatment may be referred to as a first raw material mixture. It can be also produced by using a coprecipitate containing all or a part of the elements constituting the rare earth aluminate fluorescent material. For example, a coprecipitate containing the elements can be obtained by adding an aqueous solution of alkali or carbonate to an aqueous solution containing at least one selected from the group consisting of Lu, Ce, Al, Ga, and optionally the rare earth element Ln. The coprecipitate can be also dried and heat-treated to produce the rare earth aluminate fluorescent material. The rare earth aluminate fluorescent material may be produced by using a flux, and the flux is preferably a fluoride containing an element constituting the rare earth aluminate fluorescent material. Examples of the flux include at least one selected from the group consisting of $BaF_2$, $AlF_3$, and $CeF_3$. The flux is preferably used in a range of 0.1 part by mass or more and 10 parts by mass or less, and may be used in a range of 0.5 part by mass or more and 8.0 parts by mass or less relative to 100 parts by mass of the raw material mixture (or the first raw material mixture). The mixture obtained by mixing the raw material mixture (or the first raw material mixture) and the flux may be referred to as a first mixture.

The heat treatment temperature is preferably in a range of 1,000° C. or higher and 1,800° C. or lower, may be in a range of 1,100° C. or higher and 1,750° C. or lower, may be in a range of 1,200° C. or higher and 1,700° C. or lower, may be in a range of 1,300° C. or higher and 1,650° C. or lower, and may be in a range of 1,400° C. or higher and 1,600° C. or lower. For the heat treatment, for example, an electric furnace, a gas furnace, or the like can be used.

The heat treatment atmosphere is preferably a reducing atmosphere. The heat treatment can be performed in a reducing atmosphere containing at least one of nitrogen, hydrogen, a reducing compound, and ammonia. The raw material mixture can be more reactive in a highly reductive atmosphere, so that a calcined product can be obtained by calcining the raw material mixture under an atmospheric pressure without applying pressure. Also, by heat-treating the raw material mixture in a highly reductive atmosphere, tetravalent Ce ($Ce^{4+}$) is reduced into trivalent Ce ($Ce^{3+}$), and thus a calcined product, in which the proportion of the trivalent Ce capable of contributing toward light emission increases in the calcined product, can be obtained.

The heat treatment time may vary depending on factors such as a heating rate and a heat treatment atmosphere. The heat treatment time after reaching the heat treatment temperature is preferably 1 hour or more, more preferably 2 hours or more, and even more preferably 3 hours or more; and preferably 20 hours or less, more preferably 18 hours or less, and even more preferably 15 hours or less.

In the method for producing a rare earth aluminate fluorescent material, the calcined product obtained by heat-treating the raw material mixture may be used as a first calcined product; and the first calcined product, a compound containing Lu, a compound containing Ce, a compound containing Al, a compound containing Ga, and optionally a compound containing the rare earth element Ln may be mixed and subjected to a second heat treatment to obtain a second calcined product as a rare earth aluminate fluorescent material. The mixture obtained by mixing raw materials not containing a first calcined product and containing a compound containing Lu, a compound containing Ce, a compound containing Al, a compound containing Ga, and optionally a compound containing the rare earth element Ln may be referred to as a first raw material mixture, and the heat treatment of the first raw material mixture may be referred to as a first heat treatment. The mixture obtained by mixing a first raw material mixture with a flux may be also referred to as a first mixture. The raw material mixture to be mixed with the first calcined product obtained by mixing raw materials other than the first calcined product, which are a compound containing Lu, a compound containing Ce, a compound containing Al, a compound containing Ga, and optionally a compound containing the rare earth element Ln, may be also referred to as a second raw material mixture. The content of the first calcined product in the total amount of the second calcined product and the second raw material mixture is preferably in a range of 10% by mass or more and 90% by mass or less, and may be in a range of 20% by mass or more and 80% by mass or less. The mixture of the first calcined product and the second raw material mixture may contain a flux. The mixture containing the first calcined product, the second raw material mixture, and optionally a flux is also referred to as a second mixture. When a flux is contained, the mixture is preferably used in a range of 0.1 part by mass or more and 10 parts by mass or less, and may be used in a range of 0.5 part by mass or more and 8.0 parts by mass or less relative to 100 parts by mass of the second raw material mixture.

The first heat treatment and the second heat treatment can be performed at the same heat treatment temperature, heat treatment atmosphere, and heat treatment time as described above. The calcined product obtained after the first heat treatment is also referred to as a first calcined product. The calcined product obtained after the second heat treatment is also referred to as a second calcined product.

The first calcined product and the second calcined product may be subjected to a dispersion treatment, and the dispersion treatment is performed by wet dispersion, wet sieving, dehydration, drying, dry sieving. As a solvent to be used for the wet dispersion, for example, a deionized water can be used. The time for the wet dispersion varies depending on the solid dispersion medium or solvent used, and is preferably 30 minutes or more, more preferably 60 minutes or more, even more preferably 90 minutes or more, still more preferably 120 minutes or more, and preferably 420 minutes or less. By performing the dispersion treatment, the dispersibility of the rare earth aluminate fluorescent material can be improved in the step of producing a light emitting device.

The first or second calcined product after the dispersion treatment may be subjected to an acid treatment in which the first or second calcined product is brought into contact with an acidic solution, or a base treatment in which the first or second calcined product is brought into contact with a basic solution. By bringing the first or second calcined product into contact with an acidic solution or a basic solution, decomposed products contained in the first or second calcined product and decomposed during the heat treatment can be eliminated. The acidic substance contained in the acidic solution may be an inorganic acid such as hydrofluoric acid, nitric acid, or hydrochloric acid, and may be hydrogen peroxide. The basic substance contained in the basic solution may be a hydroxide containing an alkali metal, or ammonia. The time for bringing the first or second calcined product into contact with an acidic solution or a basic solution is, for example, in a range of 10 minutes or more and 30 hours or less, preferably in a range of 30 minutes or more and 25 hours or less, and more preferably in a range of 1 hour or more and 25 hours or less, in order to eliminate thermally decomposed products contained in the first or second calcined product. The temperature at which the first or second calcined product is brought into contact with an acidic solution or a basic solution is preferably in a range of room temperature (about 20° C.) or higher and 300° C. or lower, more preferably in a range of 30° C. or higher and 200° C. or lower, and even more preferably in a range of 40° C. or higher and 150° C. or lower, in order to efficiently eliminate decomposed products contained in the first or second calcined product. After the acid treatment or the base treatment, a step of washing the first or second calcined product with a liquid medium may be included.

Each of the obtained first and second calcined products is a rare earth aluminate fluorescent material having a composition represented by the formula (I).

The light emitting device preferably contains at least one fluorescent material selected from the group consisting of a halosilicate fluorescent material having a composition represented by the following formula (II), a β-SiAlON fluorescent material having a composition represented by the following formula (III), an oxynitride fluorescent material having a composition represented by the following formula (IV), an alkaline earth metal aluminate fluorescent material having a composition represented by the following formula (V), an alkaline earth metal sulfide fluorescent material having a composition represented by the following formula (VI), a first silicate fluorescent material having a composition represented by the following formula (VII), a second silicate fluorescent material having a composition represented by the following formula (VIII), a third silicate fluorescent material or germanate fluorescent material having a composition represented by the following formula (IX), and a fourth silicate fluorescent material having a composition represented by the following formula (X), in addition to the rare earth aluminate fluorescent material having a composition represented by the formula (I):

$$(Ca,Sr,Ba)_8MgSi_4O_{16}(F,Cl,Br)_2:Eu \qquad (II),$$

$$Si_{6-z}Al_zO_zN_{8-z}:Eu \qquad (III)$$

wherein $0 < z \leq 4.2$, $$BaSi_2O_2N_2:Eu \qquad (IV),$$

$$Sr_4Al_{14}O_{25}:Eu \qquad (V),$$

$$(Sr,Ca,Ba)Ga_2S_4:Eu \qquad (VI),$$

$$(Ba,Sr,Ca)_2SiO_4:Eu \qquad (VII),$$

$$(Ba,Sr)ZrSi_3O_9:Eu \qquad (VIII),$$

$$Ca_3Sc_2(Si,Ge)_3O_{12}:Ce \qquad (IX), \text{ and}$$

$$(ALi_3SiO_4)n:Eu \qquad (X)$$

wherein A represents at least one element selected from the group consisting of Li, Na, K, Rb, and Cs, and n is an integer of 1 to 8.

In the present specification, plural elements sectioned by comma (,) in the formula representing the composition of a fluorescent material mean that at least one of these plural elements is contained in the composition, and a combination of two or more of these plural elements may be contained. In the formula representing the composition of a fluorescent material, the part before the colon (:) represents the elements and the molar ratio constituting a host crystal, and the part after the colon (:) represents an activating element. It is to be understood that the molar amount of the activating element mentioned after the colon is not necessarily the same molar amount as the part before the colon. The "molar ratio" represents the molar amount of an element in 1 mol of the composition of the fluorescent material.

At least one fluorescent material selected from the group consisting of a halosilicate fluorescent material having a composition represented by the formula (II), a β-SiAlON fluorescent material having a composition represented by the formula (III), an oxynitride fluorescent material having a composition represented by the formula (IV), an alkaline earth metal aluminate fluorescent material having a composition represented by the formula (V), an alkaline earth metal sulfide fluorescent material having a composition represented by the formula (VI), a first silicate fluorescent material having a composition represented by the formula (VII), a second silicate fluorescent material having a composition represented by the formula (VIII), a third silicate fluorescent material or germanate fluorescent material having a composition represented by the formula (IX), and a fourth silicate fluorescent material having a composition represented by the formula (X) may be excited by light emitted from a light emitting element having a dominant wavelength in a range of 400 nm or more and 500 nm or less to convert the wavelength of the light emitted from the light emitting element together with a rare earth aluminate fluorescent material having a composition represented by the formula (I), and light having a dominant wavelength in a range of 475 nm or more and 500 nm or less, in which the S/P ratio represented by the formula (1) is 6.5 or less, or the melanopic ratio represented by the formula (2) is 3.4 or less, may be emitted from the light emitting device.

Wavelength Conversion Member

The wavelength conversion member preferably includes a wavelength conversion body containing a fluorescent material and a translucent material, and more preferably includes a translucent body on which the wavelength conversion body is arranged. The wavelength conversion body preferably contains a fluorescent material and a translucent material described later. The wavelength conversion body may be formed into a plate shape, a sheet shape, or a layered shape. The wavelength conversion member may include a wavelength conversion body in a form other than a plate shape, a sheet shape, or a layered shape. The wavelength conversion member can also use a plate-shaped wavelength conversion sintered body. The plate-shaped wavelength conversion sintered body can be obtained by, for example, a method disclosed in Japanese Unexamined Patent Publication No. 2018-172628, using a mixture of a fluorescent material and an inorganic oxide as a raw material. As the inorganic oxide, for example, aluminum oxide ($Al_2O_3$) can be used.

In the light emitting device, the rare earth aluminate fluorescent material having a composition represented by the formula (I) and other fluorescent materials than the above rare earth aluminate fluorescent material preferably constitute a wavelength conversion body together with a translucent material. The wavelength conversion body may constitute a wavelength conversion member together with a translucent material. The wavelength conversion body preferably contains the rare earth aluminate fluorescent material having a composition represented by the formula (I) in a range of 1 part by mass or more and 800 parts by mass or less, more preferably in a range of 10 parts by mass or more and 750 parts by mass or less, and even more preferably in a range of 15 parts by mass or more and 700 parts by mass or less relative to 100 parts by mass of the translucent material. The light emitting device includes a wavelength conversion member including a wavelength conversion body containing the rare earth aluminate fluorescent material represented by the formula (I) which is excited by light emitted from the light emitting element, and the wavelength conversion member is arranged on the light emitting side of the light emitting element, so that the wavelength of the light emitted from the light emitting element can be efficiently converted by the rare earth aluminate fluorescent material having a composition represented by the formula (I) contained in the wavelength conversion body.

In the case where the molar ratio of Ce represented by the product of the parameter n and 3 is in the range of 0.018 or more and 0.150 or less, and the parameter n satisfies $0.006 \leq n \leq 0.050$ in the rare earth aluminate fluorescent material having a composition represented by the formula (I), the content of the rare earth aluminate fluorescent material having a composition represented by the formula (I) contained in the wavelength conversion body may be in a range of 10 parts by mass or more and 800 parts by mass or less, may be in a range of 20 parts by mass or more and 780 parts by mass or less, may be in a range of 30 parts by mass or more and 750 parts by mass or less, and may be in a range of 40 parts by mass or more and 700 parts by mass or less relative to 100 parts by mass of the translucent material.

The wavelength conversion body may contain two or more rare earth aluminate fluorescent materials having different compositions, each of which is a rare earth aluminate fluorescent material having a composition represented by the formula (I). In the case where the molar ratio of Ce represented by the product of the parameter n and 3 is in the range of 0.018 or more and 0.150 or less, and the parameter n satisfies $0.006 \leq n \leq 0.050$ in the compositions of two or more rare earth aluminate fluorescent materials having different compositions, each of which is a rare earth aluminate fluorescent material having a composition represented by the formula (I), the total content of two or more rare earth aluminate fluorescent materials contained in the wavelength conversion body may be in a range of 10 parts by mass or more and 800 parts by mass or less, may be in a range of 20 parts by mass or more and 780 parts by mass or less, may be in a range of 30 parts by mass or more and 750 parts by mass or less, and may be in a range of 40 parts by mass or more and 700 parts by mass or less relative to 100 parts by mass of the translucent material.

In the case where the molar ratio of Ga is in the range of 0.5 or more and 3.0 or less, and the molar ratio of Ce in the range of 0.015 or more and 0.040 or less in the rare earth aluminate fluorescent material having a composition represented by the formula (I), the content of the rare earth aluminate fluorescent material having a composition represented by the formula (I) contained in the wavelength conversion body may be in a range of 20 parts by mass or more and 700 parts by mass or less, may be in a range of 40 parts by mass or more and 650 parts by mass or less, may be in a range of 60 parts by mass or more and 600 parts by mass or less, and may be in a range of 80 parts by mass or more and 560 parts by mass or less relative to 100 parts by mass of the translucent material. In the case where the molar ratio of Ga is in the range of 0.5 or more and 3.0 or less and the parameter k is in the range of 0.95 or more and 1.05 or less ($0.95 \leq k \leq 1.05$) in the rare earth aluminate fluorescent material having a composition represented by the formula (I), the parameter m is in a range of 0.095 or more and 0.631 or less ($0.095 \leq m \leq 0.631$). In the case where the molar ratio of Ce is in the range of 0.015 or more and 0.040 in the rare earth aluminate fluorescent material having a composition represented by the formula (I), the parameter n is in a range of 0.005 or more and 0.013 or less ($0.005 \leq n \leq 0.013$).

In the case where the molar ratio of Ga is in the range of 0.5 or more and 2.0 or less, and the molar ratio of Ce in the range of 0.018 or more and 0.040 or less in the rare earth aluminate fluorescent material having a composition represented by the formula (I), the content of the rare earth aluminate fluorescent material having a composition represented by the formula (I) contained in the wavelength conversion body may be in a range of 20 parts by mass or more and 500 parts by mass or less, may be in a range of 30 parts by mass or more and 400 parts by mass or less, may be in a range of 40 parts by mass or more and 300 parts by mass or less relative to 100 parts by mass of the translucent material. In the case where the molar ratio of Ga is in the range of 0.5 or more and 2.0 or less and the parameter k is in the range of 0.95 or more and 1.05 or less ($0.95 \leq k \leq 1.05$) in the rare earth aluminate fluorescent material having a composition represented by the formula (I), the parameter m is in a range of 0.095 or more and 0.421 or less ($0.095 \leq m \leq 0.421$). In the case where the molar ratio of Ce is in the range of 0.018 or more and 0.040 in the rare earth aluminate fluorescent material having a composition represented by the formula (I), the parameter n is in a range of 0.006 or more and 0.013 or less ($0.006 \leq n \leq 0.013$).

The wavelength conversion body may contain at least one fluorescent material selected from the group consisting of a halosilicate fluorescent material having a composition represented by the formula (II), a β-SiAlON fluorescent material having a composition represented by the formula (III), an oxynitride fluorescent material having a composition represented by the formula (IV), an alkaline earth metal aluminate fluorescent material having a composition represented by the formula (V), an alkaline earth metal sulfide fluorescent material having a composition represented by the formula (VI), a first silicate fluorescent material having a composition represented by the formula (VII), a second silicate fluorescent material having a composition represented by the formula (VIII), a third silicate fluorescent material or germanate fluorescent material having a composition represented by the formula (IX), and a fourth silicate fluorescent material having a composition represented by the formula (X), in addition to the rare earth aluminate fluorescent material having a composition represented by the formula (I). The total amount of the fluorescent materials contained in the wavelength conversion body may be in a range of 1 part by mass or more and 900 parts by mass or less, may be in a range of 10 parts by mass or more and 850 parts by mass or less, and may be in a range of 15 parts by mass or more and 800 parts by mass or less relative to 100 parts by mass of the translucent material.

Translucent Material

Examples of the translucent material include at least one selected from the group consisting of a resin, glass, and an inorganic substance. The resin is preferably at least one selected from the group consisting of an epoxy resin, a silicone resin, a phenol resin, and a polyimide resin. Examples of the inorganic substance include at least one selected from the group consisting of aluminum oxide and aluminum nitride. The wavelength conversion body may optionally contain a filler, a colorant, and a light diffusing material in addition to the fluorescent material and the translucent material. Examples of the filler include silicon oxide, barium titanate, titanium oxide, and aluminum oxide. As for the content of the other components than the fluorescent material and the translucent material contained in the wavelength conversion body, the total content of the other components is in a range of 0.01 part by mass or more and 100 parts by mass or less, may be in a range of 0.1 part by mass or more and 80 parts by mass or less, and may be in a range of 0.5 part by mass or more and 75 parts by mass or less relative to 100 parts by mass of the translucent material.

Translucent Body

The wavelength conversion member may include a translucent body. As the translucent body a plate-shaped body made of a translucent material such as glass or resin can be used. Examples of the glass include borosilicate glass and quartz glass. Examples of the resin include a silicone resin and an epoxy resin. The thickness of the translucent body may be such that the mechanical strength is not lowered in the producing process and the wavelength conversion body can sufficiently supported.

Light Emitting Device—First Configuration Example

Figure 6A:
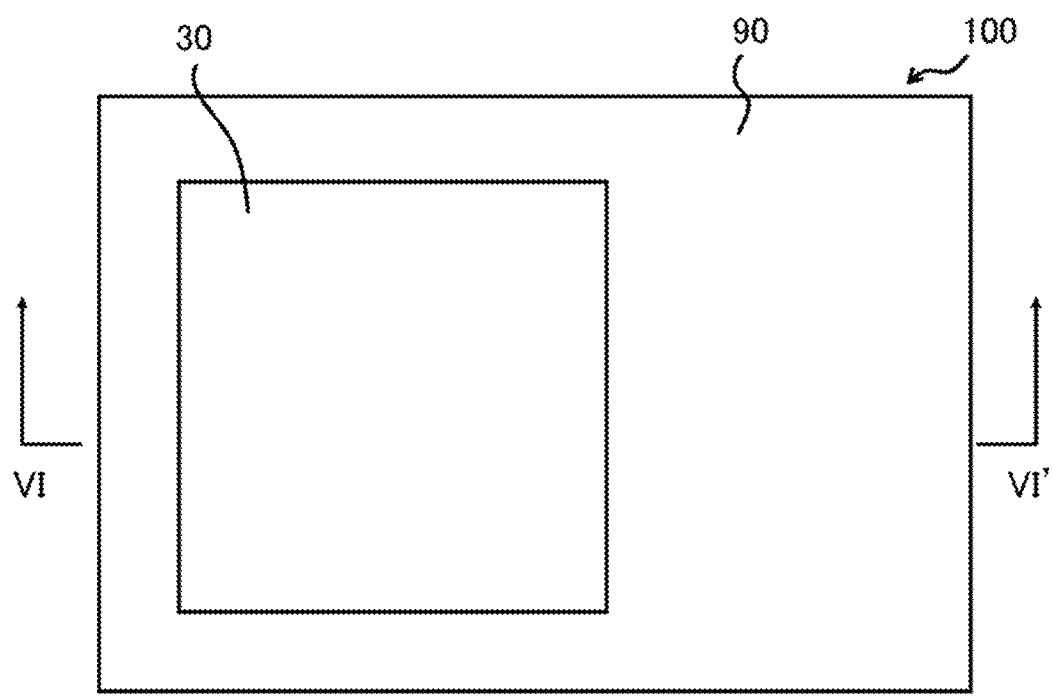
FIG. 6A is an exemplary schematic plan view of the light emitting device of the first configuration example.
Figure 6B:
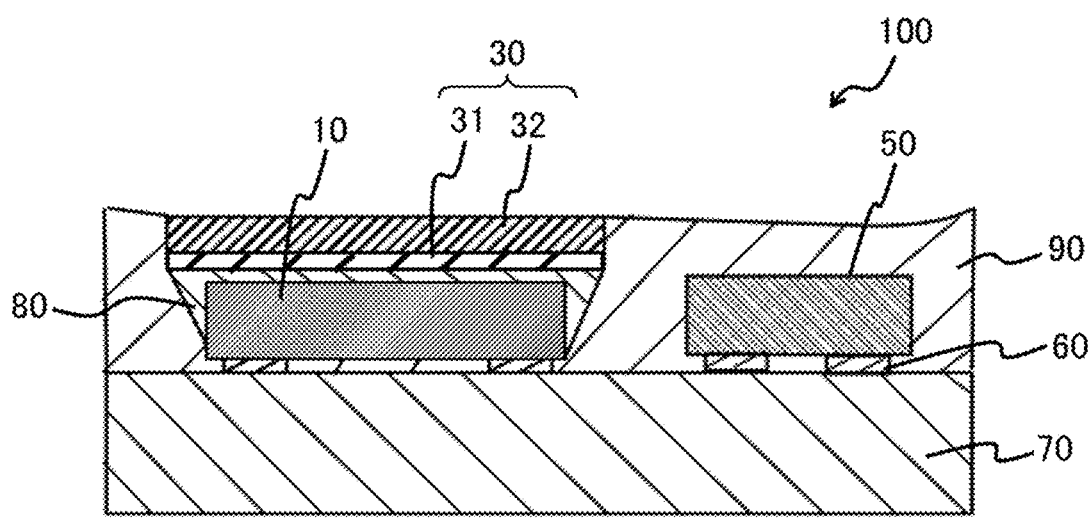
FIG. 6B is an exemplary schematic cross-sectional view of the light emitting device of the first configuration example.

Configuration examples of the light emitting device will be described. FIG. 6A is a schematic plan view of a light emitting device 100 of a first configuration example. FIG. 6B is a schematic cross-sectional view of the VI-VI' line of the light emitting device 100 shown in FIG. 6A. The light emitting device 100 includes a light emitting element 10 having a dominant wavelength in a range of 400 nm or more and 500 nm or less, and a wavelength conversion member 30 including: a wavelength conversion body 31 containing at least one fluorescent material that is excited by light emitted from the light emitting element 10 and emits light; and a translucent body 32 on which the wavelength conversion body 31 is arranged. The light emitting element 10 is flip-chip mounted on a substrate 70 via bumps which are conductive members 60. The wavelength conversion body 31 of the wavelength conversion member 30 is arranged on the light emitting surface of the light emitting element 10 via an adhesive layer 80. The side surfaces of the light emitting element 10 and the wavelength conversion member 30 are covered with a covering member 90 that reflects light. The wavelength conversion body 31 contains a fluorescent material that is excited by light emitted from the light emitting element 10 and has at least one light emission peak wavelength in a specific wavelength range. The wavelength conversion body 31 may contain two or more fluorescent materials having different light emission peak wavelength ranges. The light emitting element 10 receives electric power from the outside of the light emitting device 100 via wiring and the conductive members 60 formed on the substrate 70, so that the light emitting device 100 is able to emit light. The light emitting device 100 may include a semiconductor element 50 such as a protective element for preventing the light emitting element 10 from being destroyed by applying an excessive voltage. The covering member 90 is provided so as to cover, for example, the semiconductor element 50. Each member used in the light emitting device will be hereunder described. For the details, for example, the disclosure of Japanese Unexamined Patent Publication No. 2014-112635 may be referred to.

Substrate

The substrate is preferably made of an insulating material that is hard to transmit light from the light emitting element and external light. Examples of the material of the substrate include ceramics such as aluminum oxide and aluminum nitride, and resins such as a phenol resin, an epoxy resin, a polyimide resin, a bismaleimide triazine resin (BT resin), and a polyphthalamide (PPA) resin. Ceramics have high heat resistance and are thus preferable as a substrate material.

Adhesive Layer

The adhesive layer is interposed between the light emitting element and the wavelength conversion member to adhere the light emitting element and the wavelength conversion member together. The adhesive constituting the adhesive layer is preferably made of a material capable of optically connecting the light emitting element and the wavelength conversion member. The material constituting the adhesive layer is preferably at least one resin selected from the group consisting of an epoxy resin, a silicone resin, a phenol resin, and a polyimide resin.

Semiconductor Element

Examples of the semiconductor element optionally provided in the light emitting device include a transistor for controlling the light emitting element and a protective element for suppressing the destruction and the performance deterioration of the light emitting element due to excessive voltage application. Examples of the protective element include a Zener diode.

Covering Member

As the material of the covering member, an insulating material is preferably used. More specific examples thereof include a phenol resin, an epoxy resin, a bismaleimide triazine resin (BT resin), a polyphthalamide (PPA) resin, and a silicone resin. A colorant, a fluorescent material, and a filler may be optionally added to the covering member.

Conductive Member

As the conductive member, a bump can be used. Examples of the material of the bump include Au and an alloy thereof, and examples of the other conductive member include eutectic solder (Au—Sn), Pb—Sn, and lead-free solder.

Method for Producing Light Emitting Device—First Configuration Example

An example of the method for producing a light emitting device will be described. For the details, for example, the disclosure of Japanese Unexamined Patent Publication No. 2014-112635 or Japanese Unexamined Patent Publication No. 2017-117912 may be referred to. The method for producing a light emitting device preferably includes a step of arranging a light emitting element, optionally a step of arranging a semiconductor element, a step of forming a wavelength conversion member including a wavelength conversion body, a step of adhering a light emitting element and a wavelength conversion member, and a step of forming a covering member.

Step of Arranging Light Emitting Element

In the step of arranging a light emitting element, the light emitting element is arranged and mounted on the substrate. For example, the light emitting element and the semiconductor element are flip-chip mounted on the substrate.

Step of Forming Wavelength Conversion Member Including Wavelength Conversion Body In the step of forming a wavelength conversion member including a wavelength conversion body, the wavelength conversion body may be obtained by forming a plate-shaped, sheet-shaped, or layered wavelength conversion body on one surface of the translucent body by a printing method, an adhesive method, a compression molding method, or an electrodeposition method. For example, in the printing method, the composition for a wavelength conversion body containing a fluorescent material and a resin serving as a binder or a solvent can be printed on one surface of the translucent body to form a wavelength converter member including the wavelength conversion body.

Step of Adhering Light Emitting Element and Wavelength Conversion Member

In the step of adhering a light emitting element and a wavelength conversion member, the wavelength conversion member is opposed to the light emitting surface of the light emitting element, and the wavelength conversion member is adhered onto the light emitting element by the adhesive layer.

Step of Forming Covering Member

In the step of forming a covering member, the side surfaces of the light emitting element and the wavelength conversion member excluding the light emitting surface are covered with the composition for a covering member, and the covering member is formed on the side surfaces of the light emitting element and the wavelength conversion member excluding the light emitting surface. The covering member is for reflecting light emitted from the light emitting element, and is formed so as to cover the side surfaces without covering the light emitting surface of the wavelength conversion member and to embed the semiconductor element.

As described above, the light emitting device shown in FIGS. 6A and 6B can be produced.

Light Emitting Device—Second Configuration Example

Figure 7:
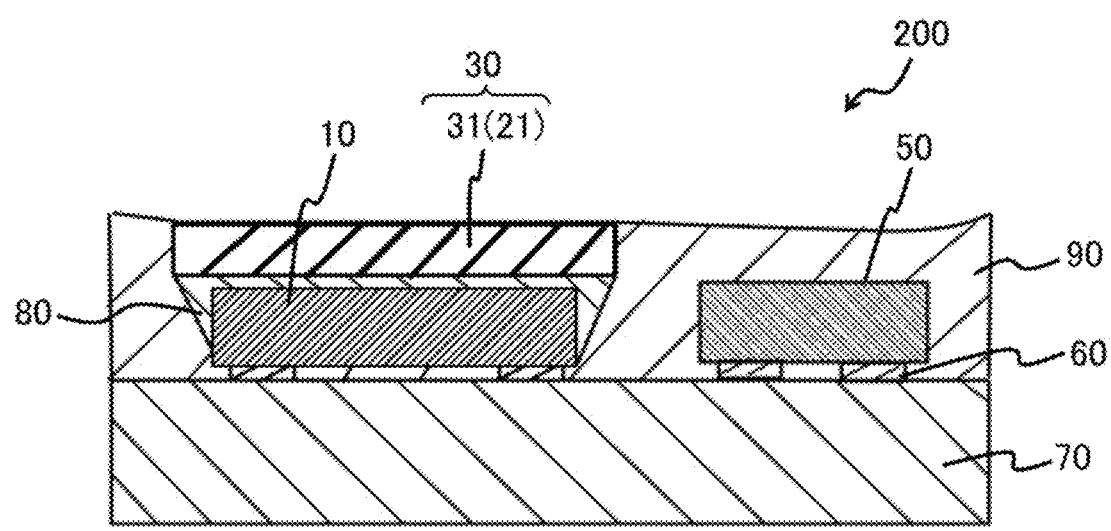
FIG. 7 is a schematic cross-sectional view of the light emitting device of the second configuration example.

FIG. 7 is a schematic cross-sectional view of a light emitting device 200 of a second configuration example. The light emitting device 200 is the same as the light emitting device 100 except that the light emitting device 200 includes a wavelength conversion member 30 composed of a wavelength conversion body 31 containing at least one fluorescent material that is excited by light emitted from a light emitting element 10 and emits light. In FIG. 7, the same reference numerals are described to the same members as in the light emitting device 100. The wavelength conversion member 30 may be composed of the wavelength conversion body 31 without including the translucent body 32.

Method for Producing Light Emitting Device—Second Configuration Example

The light emitting device of the second configuration example can be produced in the same manner as the method for producing the light emitting device of the first configuration example except that a wavelength conversion member composed of a wavelength conversion body is formed in the step of forming a wavelength conversion member. The wavelength conversion body is formed into a plate shape, a sheet shape, or a layered shape in advance by curing a composition for the wavelength conversion body containing a fluorescent material and a translucent material, and the resulting wavelength conversion body is separated into individual pieces of a size that can be arranged on the light emitting element, thereby preparing a wavelength conversion member composed of the plate-shaped, sheet-shaped, or layered-shaped wavelength conversion body. As described above, the light emitting device of the second configuration example can be produced. The wavelength conversion member can also use a plate-shaped wavelength conversion sintered body, as described above.

Light Emitting Device—Third Configuration Example

Figure 8:
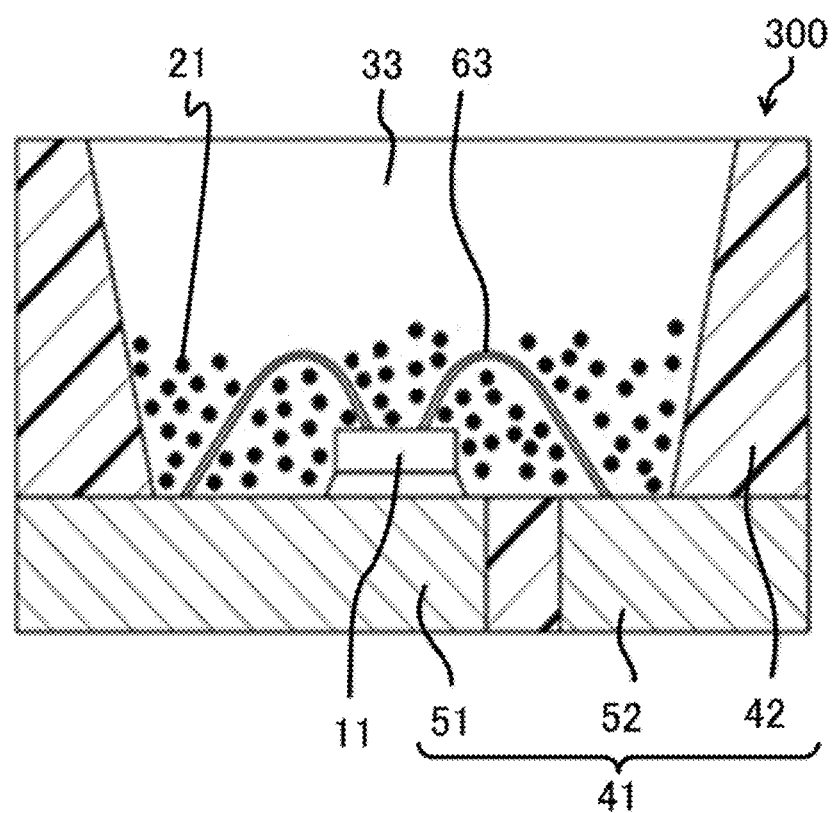
FIG. 8 is a schematic cross-sectional view of the light emitting device of the third configuration example.

FIG. 8 is a schematic cross-sectional view of a light emitting device 300 of a third configuration example. The light emitting device 300 includes, for example, a molded body 41, a light emitting element 11, and a wavelength conversion member 33. The molded body 41 is formed by integrally molding a first lead 51, a second lead 52, and a resin portion 42 containing a thermoplastic resin or a thermosetting resin. The molded body 40 forms a recessed part having a bottom surface and side surfaces, in which the light emitting element 11 is mounted on the bottom surface of the recessed part. The light emitting element 11 has a pair of positive and negative electrodes, and the pair of positive and negative electrodes are electrically connected to the first lead 51 and the second lead 52, respectively, each via a wire 63. The light emitting element 11 is covered with the wavelength conversion member 33. The wavelength conversion member 33 contains a fluorescent material 21 that undergoes wavelength conversion of light emitted from the light emitting element 12, and a translucent material. The fluorescent material 21 has at least one light emission peak wavelength in a specific wavelength range by being excited by light emitted from the light emitting element, and may contain two or more fluorescent materials having different light emission peak wavelength ranges. The first lead 51 and the second lead 52 each connected to the pair of positive and negative electrodes of the light emitting element 11 are partly exposed toward outside a package constituting the light emitting device 300. Via these first lead 51 and the second lead 52, the light emitting device 300 receives external power to emit light.

The translucent material used for the wavelength conversion member can use the same translucent material used for the wavelength conversion member of the first configuration example or the second configuration example. The wavelength conversion member may optionally contain a filler, a colorant, and a light diffusing material in the same manner as the wavelength conversion members of the first configuration example and the second configuration example.

Method for Producing Light Emitting Device—Third Configuration Example

The method for producing the light emitting device of the third configuration example will be described. For the details, for example, the disclosure of Japanese Unexamined Patent Publication No. 2010-062272 may be referred to. The method for producing the light emitting device preferably includes a step of preparing a molded body, a step of arranging a light emitting element, a step of arranging a composition for a wavelength conversion member, and a step of forming a resin package. When an aggregate molded body having a plurality of recessed parts is used as the molded body, the method may include an individualization step of separating each resin package in each unit area after the step of forming a resin package.

In the step of preparing a molded body, a plurality of leads are integrally molded using a thermosetting resin or a thermoplastic resin to prepare a molded body having a recessed part having side surfaces and a bottom surface. The molded body may be composed of an aggregate substrate including a plurality of recessed parts.

In the step of arranging a light emitting element, the light emitting element is arranged on the bottom surface of the recessed part of the molded body, and the positive and negative electrodes of the light emitting element are connected to the first lead and the second lead, respectively, via wires.

In the step of arranging a composition for a wavelength conversion member, the composition for a wavelength conversion member is arranged in the recessed part of the molded body.

In the step of forming a resin package, the composition for a wavelength conversion member arranged in the recessed part of the molded body is cured to form a resin package, thereby producing a light emitting device. When using a molded body composed of an aggregate substrate having a plurality of recessed parts, the resin package is separated into each unit area of the aggregate substrate having a plurality of recessed parts in the individualization step after the step of forming a resin package, thereby producing an individual light emitting device. As described above, the light emitting device of the third configuration example shown in FIG. 8 can be produced.

EXAMPLES

The present disclosure is hereunder specifically described by reference to the following Examples. The present disclosure is not limited to these Examples.

Rare Earth Aluminate Fluorescent Material A
Preparation of Raw Materials

Lutetium oxide ($Lu_2O_3$), cerium oxide ($CeO_2$), aluminum oxide ($Al_2O_3$), and gallium oxide ($Ga_2O_3$) were used as raw materials, and the raw materials composed of the compounds were prepared such that each element of Lu, Ce, Al, and Ga contained in the compounds satisfied the following composition, thereby obtaining a raw material mixture. Barium fluoride ($BaF_2$) serving as a flux was added therein in an amount of 7.0% by mass relative to 100% by mass of the total amount, and the raw materials were mixed using a ball mill to obtain a mixture. The raw materials were prepared such that the charged composition was $(Lu_{0.987}Ce_{0.012})_3(Al_{0.9}Ga_{0.1})_5O_{12}$.

Heat Treatment

The obtained mixture was placed in an alumina crucible, and heat-treated at 1,600° C. for 10 hours in a reducing atmosphere to obtain a calcined product.

Dispersion Treatment

The obtained calcined product, an alumina ball serving as a dispersion medium, and deionized water were placed in a container, and dispersed for 4 hours while rotating the container. Thereafter, coarse particles were eliminated by performing wet-type sieving. Subsequently, sedimentary classification was performed to eliminate fine particles.

Acid Washing Treatment

The calcined product obtained by the sedimentary classification was acid-washed with a hydrochloric acid aqueous solution having a hydrochloric acid concentration of 17% by mass, then washed with water, and separated and dried, thereby obtaining a calcined product after the acid washing treatment as a rare earth aluminate fluorescent material A.

Rare Earth Aluminate Fluorescent Material B

A rare earth aluminate fluorescent material B was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.987}Ce_{0.013})_3(Al_{0.8}Ga_{0.2})_5O_{12}$.

Rare Earth Aluminate Fluorescent Material C

A rare earth aluminate fluorescent material C was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.987}Ce_{0.012})_3(Al_{0.7}Ga_{0.3})_5O_{12}$.

Rare Earth Aluminate Fluorescent Material D

A rare earth aluminate fluorescent material D was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.987}Ce_{0.012})_3(Al_{0.6}Ga_{0.4})_5O_{12}$.

Rare Earth Aluminate Fluorescent Material E

The raw materials composed the compounds were prepared such that each element of Lu, Ce, Al, and Ga satisfied the following composition. A rare earth aluminate fluorescent material E was obtained in the same manner as the rare earth aluminate fluorescent material A except that the heat treatment was performed at 1,500° C. for 10 hours. The raw materials were prepared such that the charged composition was $(Lu_{0.995}Ce_{0.005})_3(Al_{0.6}Ga_{0.4})_5O_{12}$.

Rare Earth Aluminate Fluorescent Material F

A rare earth aluminate fluorescent material F was obtained in the same manner as the rare earth aluminate fluorescent material E except that the raw materials composed the compounds were prepared such that each element of Lu, Ce, Al, and Ga satisfied the following composition. The raw materials were prepared such that the charged composition was $(Lu_{0.995}Ce_{0.005})_3(Al_{0.5}Ga_{0.5})_5O_{12}$.

Rare Earth Aluminate Fluorescent Material G

A rare earth aluminate fluorescent material G was obtained in the same manner as the rare earth aluminate fluorescent material E except that the raw materials composed the compounds were prepared such that each element of Lu, Ce, Al, and Ga satisfied the following composition. The raw materials were prepared such that the charged composition was $(Lu_{0.995}Ce_{0.005})_3(Al_{0.4}Ga_{0.6})_5O_{12}$.

Rare Earth Aluminate Fluorescent Material H

A rare earth aluminate fluorescent material H was obtained in the same manner as the rare earth aluminate fluorescent material E except that the heat treatment was performed at 1,500° C. for 10 hours in an air atmosphere. The raw materials were prepared such that the charged composition was $(Lu_{0.995}Ce_{0.005})_3(Al_{0.6}Ga_{0.4})_5O_{12}$.

Rare Earth Aluminate Fluorescent Material I

Preparation of Raw Materials (First Mixture)

Lutetium oxide ($Lu_2O_3$), cerium oxide ($CeO_2$), aluminum oxide ($Al_2O_3$), and gallium oxide ($Ga_2O_3$) were used as raw materials, and the raw materials composed of the compounds were prepared such that each element of Lu, Ce, Al, and Ga contained in the compounds satisfied the following composition. Barium fluoride ($BaF_2$) serving as a flux was added therein in an amount of 7.0% by mass relative to 100% by mass of the total amount, and the raw materials were mixed using a ball mill to obtain a first mixture. The raw materials were prepared such that the charged composition was $(Lu_{0.995}Ce_{0.005})_3(Al_{0.6}Ga_{0.4})_5O_{12}$.

First Heat Treatment

The obtained first mixture was placed in an alumina crucible, and heat-treated at 1,500° C. for 10 hours in a reducing atmosphere to obtain a first calcined product.

Second Mixture

The obtained first calcined product, lutetium oxide ($Lu_2O_3$), cerium oxide ($CeO_2$), aluminum oxide ($Al_2O_3$), and gallium oxide ($Ga_2O_3$) were used as raw materials; the raw materials composed of the compounds were prepared such that each element of Lu, Ce, Al, and Ga contained in both the first calcined product and the compounds satisfied the composition; and barium fluoride ($BaF_2$) serving as a flux was added in an amount of 7.0% by mass relative to 100% by mass of the total amount to obtain a second raw material mixture. The first calcined product and the second raw material mixture were mixed using a ball mill so as to have a mass ratio of 7:3 to obtain a second mixture.

Second Heat Treatment

The obtained second mixture was placed in an alumina crucible, and heat-treated at 1,500° C. for 10 hours in a reducing atmosphere to obtain a second calcined product. The second calcined product was subjected to the dispersion treatment and the acid washing treatment in the same manner as the rare earth aluminate fluorescent material A to obtain a rare earth aluminate fluorescent material I.

Rare Earth Aluminate Fluorescent Material J

A rare earth aluminate fluorescent material J was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.993}Ce_{0.007})_3(Al_{0.6}Ga_{0.4})_5O_{12}$.

Rare Earth Aluminate Fluorescent Material K

A rare earth aluminate fluorescent material K was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.992}Ce_{0.008})_3(Al_{0.6}Ga_{0.4})_5O_{12}$.

Rare Earth Aluminate Fluorescent Material L

A rare earth aluminate fluorescent material L was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.990}Ce_{0.010})_3(Al_{0.6}Ga_{0.4})_5O_{12}$.

Rare Earth Aluminate Fluorescent Material M

A rare earth aluminate fluorescent material M was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.988}Ce_{0.012})_3(Al_{0.6}Ga_{0.4})_5O_{12}$.

Rare Earth Aluminate Fluorescent Material N

A rare earth aluminate fluorescent material N was obtained in the same manner as the rare earth aluminate fluorescent material A except that the raw materials composed the compounds were prepared such that each element of Lu, Ce, Al, and Ga satisfied the following composition. The raw materials were prepared such that the charged composition was $(Lu_{0.987}Ce_{0.013})_3(Al_{0.6}Ga_{0.4})_5O_{12}$.

Evaluation of Rare Earth Aluminate Fluorescent Materials

The obtained rare earth aluminate fluorescent materials were evaluated as follows. The evaluation results are shown in Table 1. Ga (molar ratio) and Ce (molar ratio) in Table 1 are molar ratios of each element in the charged composition.

Light Emission Characteristics

The light emission characteristics of each fluorescent material were measured. As for the light emission characteristics of the fluorescent materials, using a quantum efficiency measuring apparatus (QE-2000, manufactured by Otsuka Electronics Co., Ltd.), each fluorescent material was irradiated with excitation light having a wavelength of 420 nm to measure the light emission spectrum at room temperature (25° C.±5° C.). From the light emission spectrum of each fluorescent material, the chromaticity coordinates (x, y) in the chromaticity coordinate system of the CIE chromaticity diagram and the luminance (%) were determined for each fluorescent material.

TABLE 1

| Rare earth aluminate fluorescent material | Composition | | Chromaticity coordinates | | Luminance (%) |
| --- | --- | --- | --- | --- | --- |
| | Ga (molar ratio) | Ce (molar ratio) | x | y | |
| Fluorescent material A | 0.5 | 0.035 | 0.303 | 0.574 | 123.2 |
| Fluorescent material B | 1.0 | 0.040 | 0.279 | 0.558 | 123.6 |
| Fluorescent material C | 1.5 | 0.040 | 0.257 | 0.535 | 119.5 |
| Fluorescent material D | 2.0 | 0.040 | 0.240 | 0.512 | 115.1 |
| Fluorescent material E | 2.0 | 0.015 | 0.211 | 0.461 | 93.6 |
| Fluorescent material F | 2.5 | 0.015 | 0.195 | 0.421 | 78.1 |
| Fluorescent material G | 3.0 | 0.015 | 0.186 | 0.392 | 67.3 |
| Fluorescent material H | 2.0 | 0.015 | 0.198 | 0.445 | 80.5 |
| Fluorescent material I | 2.0 | 0.015 | 0.215 | 0.470 | 100.4 |
| Fluorescent material J | | 0.020 | 0.219 | 0.489 | 104.2 |
| Fluorescent material K | | 0.025 | 0.228 | 0.502 | 110.6 |
| Fluorescent material L | | 0.030 | 0.243 | 0.517 | 113.6 |
| Fluorescent material M | | 0.035 | 0.230 | 0.504 | 111.6 |
| Fluorescent material N | | 0.040 | 0.237 | 0.512 | 115.1 |

Examples 1-1 to 1-3

The rare earth aluminate fluorescent material A was used to produce a light emitting device. As for the method of producing the light emitting device, the disclosure of Japanese Unexamined Patent Publication No. 2010-062272 can be referred to. Specifically a molded body including a first lead, a second lead, and a recessed part having a bottom surface and side surfaces was prepared. A light emitting element using a nitride semiconductor having a dominant wavelength of 455 nm was prepared, and the light emitting element was arranged on the bottom surface of the recessed part and connected to the first lead and the second lead by wires. A composition for a wavelength conversion body containing the rare earth aluminate fluorescent material A in an amount shown in Table 2 (Example 1-1: 20 parts by mass, Example 1-2: 40 parts by mass, Example 1-3: 60 parts by mass) relative to 100 parts by mass of a silicone resin serving as a translucent material was prepared, and the composition for a wavelength conversion body was filled into the recessed part of the molded body. The composition for a wavelength conversion body was cured by heating at 150° C. for 4 hours, and a resin package was formed by forming a wavelength conversion member composed of a wavelength conversion body covering the light emitting element, thereby producing a light emitting device.

Examples 2-1 to 2-3

The rare earth aluminate fluorescent material B was used to produce a light emitting device. A light emitting device was produced in the same manner as in Example 1-1 except that a composition for a wavelength conversion body containing the rare earth aluminate fluorescent material B in an amount shown in Table 2 (Example 2-1: 20 parts by mass, Example 2-2: 40 parts by mass, Example 2-3: 60 parts by mass) was prepared and used.

Examples 3-1 to 3-3

The rare earth aluminate fluorescent material C was used to produce a light emitting device. A light emitting device was produced in the same manner as in Example 1-1 except that a composition for a wavelength conversion body containing the rare earth aluminate fluorescent material C in an amount shown in Table 2 (Example 3-T 40 parts by mass, Example 3-2: 60 parts by mass, Example 3-3: 80 parts by mass) was prepared and used.

Comparative Example 4-1 and Examples 4-2 to 4-5

The rare earth aluminate fluorescent material D was used to produce a light emitting device. A light emitting device was produced in the same manner as in Example 1-1 except that a composition for a wavelength conversion body containing the rare earth aluminate fluorescent material D in an amount shown in Table 2 (Comparative Example 4-1: 20 parts by mass, Example 4-2: 40 parts by mass, Example 4-3: 60 parts by mass, Example 4-4: 90 parts by mass, Example 4-5: 120 parts by mass) was prepared and used.

Comparative Example 1

A light emitting device of the first embodiment was produced in the same manner as in Example 1-1 except that a light emitting element using a nitride semiconductor having a dominant wavelength of 454 nm was prepared, and the fluorescent materials were not used.

Comparative Example 2

A light emitting device of the first embodiment was produced in the same manner as in Example 1-1 except that a light emitting element using a nitride semiconductor having a dominant wavelength of 484 nm was prepared, and the fluorescent materials were not used.

Comparative Example 3

A light emitting device of the first embodiment was produced in the same manner as in Example 1-1 except that a light emitting element using a nitride semiconductor having a dominant wavelength of 495 nm was prepared, and the fluorescent materials were not used.

The following evaluations were performed for each light emitting element and each light emitting device. The evaluation results of each light emitting device are shown in Table 2.

Evaluation of Light Emitting Element (Dominant Wavelength of Light Emitting Element)

For the light emitting element used in each of Examples and Comparative Examples, the chromaticity coordinates (x, y) in the chromaticity coordinate system of the CIE 1931 chromaticity diagram were measured using an optical measurement system that combines a spectrophotometer (PMA-11, Hamamatsu Photonics K.K.) and an integral sphere. Then, the chromaticity coordinates (x=0.3333, y=0.3333) of white light and the chromaticity coordinates ($x_E$, $y_E$) of the light emission color of each light emitting element in the CIE 1931 chromaticity diagram were connected by a straight line, and the wavelength at the intersection of the extension line thereof and the spectrum locus was determined as the dominant wavelength.

Evaluation of Light Emitting Device
Luminous Flux, Luminous Flux Ratio, Radiant Flux (Spectral Total Radiant Flux), and Chromaticity Coordinates (x, y) of Light Emitting Device For each light emitting device, using an optical measurement system that combines a spectrophotometer (PMA-11, Hamamatsu Photonics K.K.) and an integral sphere, the luminous flux, the radiant flux (spectral total radiant flux: mW), and the chromaticity coordinates (x, y) in the chromaticity coordinate system of the CIE 1931 chromaticity diagram were determined.

Dominant Wavelength λd of Light Emitting Device

As for the dominant wavelength of each light emitting device, the chromaticity coordinates (x=0.3333, y=0.3333) of white light and the chromaticity coordinates (x, y) of the light emission color of each light emitting device in the CIE 1931 chromaticity diagram were connected by a straight line, and the wavelength at the intersection of the extension line thereof and the spectrum locus was determined as the dominant wavelength.

S/P Ratio

For each light emitting device, the S/P ratio, which was the ratio of a luminous flux in scotopic vision relative to a luminous flux in photopic vision, was calculated based on the above formula (1).

Light Emission Spectrum of Light Emitting Device

For each light emitting device, the light emission spectrum at room temperature (25° C.±5° C.) was measured using an optical measurement system that combines a spectrophotometer (PMA-11, Hamamatsu Photonics K.K.) and an integral sphere. For each light emitting device, the maximum light emitting intensity was set to 1 in the light emitting spectrum of each light emitting device, and the relative light emission spectrum was determined.

Melanopic Ratio

The melanopic ratio was calculated from the spectral distribution of each light emitting device, the sensitivity curve (absorbance) of ipRGC, and the visual sensitivity curve in human photopic vision, based on the above formula (2).

Integrated Value Ratio Ib/Ia of Light Emission Spectrum

In the relative light emission spectrum of each light emitting device, the integrated value ratio Ib/Ia of the integrated value Ib in a wavelength range of 380 nm or more and 531 nm or less relative to the integrated value Ia in a wavelength range of 380 nm or more and 780 nm or less was determined.

TABLE 2

| | Fluorescent material | Fluorescent material amount (parts by mass) | Luminous flux (lm) | Radiant flux (mW) | x | y | Dominant wavelength λd | Melanopic ratio | S/P ratio | Ib/Ia |
|---|---|---|---|---|---|---|---|---|---|---|
| Example 1-1 | Fluorescent material A | 20 | 27.6 | 117.1 | 0.207 | 0.230 | 480 | 1.86 | 3.8 | 0.74 |
| Example 1-2 | | 40 | 35.0 | 115.6 | 0.234 | 0.325 | 491 | 1.39 | 3.1 | 0.65 |
| Example 1-3 | | 60 | 38.2 | 114.1 | 0.249 | 0.375 | 498 | 1.22 | 2.8 | 0.61 |
| Example 2-1 | Fluorescent material B | 20 | 23.2 | 119.0 | 0.190 | 0.182 | 476 | 2.34 | 4.6 | 0.80 |
| Example 2-2 | | 40 | 27.7 | 117.2 | 0.202 | 0.235 | 481 | 1.92 | 4.0 | 0.75 |
| Example 2-3 | | 60 | 32.8 | 115.3 | 0.220 | 0.304 | 488 | 1.56 | 3.4 | 0.69 |
| Example 3-1 | Fluorescent material C | 40 | 24.9 | 117.7 | 0.191 | 0.206 | 479 | 2.22 | 4.5 | 0.79 |
| Example 3-2 | | 60 | 28.7 | 116.7 | 0.201 | 0.251 | 483 | 1.90 | 3.9 | 0.75 |
| Example 3-3 | | 80 | 34.0 | 113.0 | 0.221 | 0.335 | 492 | 1.52 | 3.3 | 0.68 |
| Comparative Example 4-1 | Fluorescent material D | 20 | 18.8 | 118.9 | 0.175 | 0.143 | 473 | 3.02 | 5.8 | 0.85 |
| Example 4-2 | | 40 | 25.4 | 116.2 | 0.190 | 0.217 | 480 | 2.19 | 4.4 | 0.78 |
| Example 4-3 | | 60 | 26.1 | 116.0 | 0.192 | 0.225 | 481 | 2.12 | 4.3 | 0.78 |
| Example 4-4 | | 90 | 28.8 | 114.1 | 0.200 | 0.264 | 485 | 1.88 | 3.9 | 0.74 |
| Example 4-5 | | 120 | 31.2 | 112.7 | 0.208 | 0.301 | 488 | 1.71 | 3.7 | 0.72 |
| Comparative Example 1 | none | none | 4.1 | 126.0 | 0.153 | 0.025 | 454 | 14.0 | 23.3 | 1.00 |
| Comparative Example 2 | | | 14.7 | 112.0 | 0.094 | 0.191 | 484 | 5.6 | 10.2 | 0.99 |
| Comparative Example 3 | | | 15.4 | 73.0 | 0.069 | 0.399 | 495 | 3.5 | 7.0 | 0.97 |

The light emitting device of each Example emitted light having a dominant wavelength in the range of 475 nm or more and 500 nm or less, and the S/P ratio, which was the ratio of a luminous flux in scotopic vision relative to a luminous flux in photopic vision, was 6.5 or less. It is considered that the light emitting device of each Example reduces the difference between the luminous flux in a dark place and the luminous flux in a bright place even when emitting light having a dominant wavelength in the wavelength range from blue to green including bluish-green, so that the light can be brightly seen in both scotopic vision and photopic vision while maintaining excellent visibility.

The light emitting device of each Example emitted light having a dominant wavelength in the range of 475 nm or more and 500 nm or less, and the melanopic ratio was 3.4 or less. It is considered that the light emitting device of each Example is less likely to have a significant effect on human circadian rhythms, and is able to emit light having a dominant wavelength in the wavelength range from blue to green including bluish-green, which is capable of reminding a specific behavior by a signal color representing a specific state of the apparatus such as charging.

The light having a dominant wavelength in the range of 475 nm or more and 500 nm or less emitted from the light emitting device of each Example exhibited a light emission color within the area A1 shown in FIG. 3 and the area A2 shown in FIG. 4, in the xy chromaticity coordinate system of the CIE 1931 chromaticity diagram. The light emitted from the light emitting device of each of Example 3-2, Example 4-2, Example 4-3, Example 4-4, and Example 4-5 exhibited a blue to bluish-green light emission color within the area A3 shown in FIG. 5 among the areas A1 and A2.

The integrated value ratio Ib/Ia in the light emitting device of each Example was in the range of 0.6 or more and 0.95 or less. It is considered that the light emitting device of each Example is able to emit light which is bright in both scotopic vision and photopic vision while maintaining excellent visibility, in which the difference in brightness perceived by humans can be reduced in both scotopic vision and photopic vision.

The light emitting device of Comparative Example 1 emitted light having a dominant wavelength of less than 475 nm, and the S/P ratio was more than 6.5. It is assumed that the light may be perceived as too bright when viewed in a dark place. The light emitting device of Comparative Example 1 emitted light having a dominant wavelength of less than 475 nm, and the melanopic ratio was more than 3.4. It is considered that it may affect human circadian rhythms. The light emitting device of Comparative Example 1 emitted light having a dominant wavelength of less than 475 nm, and the light did not exhibit the light emission color within the area A1 shown in FIG. 3. Further, the integrated value ratio Ib/Ia in the light emitting device of Comparative Example 1 was more than 0.95. It is assumed that the light may be perceived as too bright when viewed in a dark place.

The light emitting device of Comparative Example 2 emitted light having a dominant wavelength in the range of 475 nm or more and 500 nm or less, but the S/P ratio was more than 6.5. It is assumed that the light may be perceived as too bright when viewed in a dark place. The light emitting device of Comparative Example 2 emitted light having a dominant wavelength in a range of 475 nm or more and 500 nm or less, and the melanopic ratio was more than 3.4. It is considered that it may affect human circadian rhythms. The light emitting device of Comparative Example 2 emitted light having a dominant wavelength in the range of 475 nm or more and 500 nm or less, and the light exhibited the light emission color within the area A1 shown in FIG. 3, but did not exhibit the light emission color within the area A2 shown in FIG. 4 and the area A3 shown in FIG. 5. Further, the integrated value ratio Ib/Ia in the light emitting device of Comparative Example 2 was more than 0.95. It is assumed that the light may be perceived as too bright when viewed in a dark place.

The light emitting device of Comparative Example 3 emitted light having a dominant wavelength in the range of 475 nm or more and 500 nm or less, but the S/P ratio was more than 6.5. It is assumed that the light may be perceived as too bright when viewed in a dark place. The light emitting device of Comparative Example 3 emitted light having a dominant wavelength in a range of 475 nm or more and 500 nm or less, and the melanopic ratio was more than 3.4. It is considered that it may affect human circadian rhythms. The light emitting device of Comparative Example 3 emitted light having a dominant wavelength in the range of 475 nm or more and 500 nm or less, and the light exhibited the light emission color within the area A1 shown in FIG. 3 and the area A2 shown in FIG. 4, but did not exhibit the light emission color within the area A3 shown in FIG. 5. Further, the integrated value ratio Ib/Ia in the light emitting device of Comparative Example 3 was more than 0.95. It is assumed that the light may be perceived as too bright when viewed in a dark place.

The light emitting device of Comparative Example 4-1 had a relatively large molar ratio of Ga and a relatively large molar ratio of Ce in the composition of the rare earth aluminate fluorescent material D contained in the wavelength conversion member, and thus the light emission peak wavelength of the rare earth aluminate fluorescent material D was shifted compared to the fluorescent material having a small molar ratio of Ga. Accordingly the light emitting device of Comparative Example 4-1 did not emit light having a dominant wavelength in the range of 475 nm or more and 500 nm or less since the content of the rare earth aluminate fluorescent material D was small.

Comparative Examples 5-1 to 5-2 and Examples 5-3 to 5-7

The rare earth aluminate fluorescent material E was used to produce a light emitting device. A light emitting device was produced in the same manner as in Example 1-1 except that a composition for a wavelength conversion body containing the rare earth aluminate fluorescent material E in an amount shown in Table 3 (Comparative Example 5-1: 20 parts by mass, Comparative Example 5-2-40 parts by mass, Example 5-3: 60 parts by mass, Example 5-4: 90 parts by mass, Example 5-5: 120 parts by mass, Example 5-6: 200 parts by mass, Example 5-7: 280 parts by mass) was prepared and used.

Comparative Examples 6-1 to 6-4 and Examples 6-5 to 6-9

The rare earth aluminate fluorescent material F was used to produce a light emitting device. A light emitting device was produced in the same manner as in Example 1-1 except that a composition for a wavelength conversion body containing the rare earth aluminate fluorescent material F in an amount shown in Table 3 (Comparative Example 6-1: 20 parts by mass, Comparative Example 6-2: 40 parts by mass, Comparative Example 6-3: 60 parts by mass, Comparative Example 6-4: 100 parts by mass, Example 6-5: 200 parts by mass, Example 6-6: 300 parts by mass, Example 6-7: 400 parts by mass, Example 6-8: 450 parts by mass, Example 6-9: 550 parts by mass) was prepared and used.

Comparative Examples 7-1 to 7-4 and Examples 7-5 to 7-11

The rare earth aluminate fluorescent material G was used to produce a light emitting device. A light emitting device was produced in the same manner as in Example 1-1 except that a composition for a wavelength conversion body containing the rare earth aluminate fluorescent material G in an amount shown in Table 3 (Comparative Example 7-V 20 parts by mass, Comparative Example 7-2-40 parts by mass, Comparative Example 7-3: 60 parts by mass, Comparative Example 7-4: 150 parts by mass, Example 7-5: 250 parts by mass, Example 7-6: 350 parts by mass, Example 7-7: 450 parts by mass, Example 7-8: 560 parts by mass, Example 7-9: 600 parts by mass, Example 7-10: 650 parts by mass, Example 7-11: 700 parts by mass) was prepared and used.

Comparative Examples 8-1 to 8-4 and Examples 8-5 to 8-8

The rare earth aluminate fluorescent material H was used to produce a light emitting device. A light emitting device was produced in the same manner as in Example 1-1 except that a composition for a wavelength conversion body containing the rare earth aluminate fluorescent material H in an amount shown in Table 3 (Comparative Example 8-1: 20 parts by mass, Comparative Example 8-2-40 parts by mass, Comparative Example 8-3: 60 parts by mass, Comparative Example 8-4: 100 parts by mass, Example 8-5: 200 parts by mass, Example 8-6: 300 parts by mass, Example 8-7: 400 parts by mass, Example 8-8: 450 parts by mass) was prepared and used.

Comparative Examples 9-1 to 9-2 and Examples 9-3 to 9-6

The rare earth aluminate fluorescent material I was used to produce a light emitting device. A light emitting device was produced in the same manner as in Example 1-1 except that a composition for a wavelength conversion body containing the rare earth aluminate fluorescent material I in an amount shown in Table 3 (Comparative Example 9-1: 20 parts by mass, Comparative Example 9-2-40 parts by mass, Example 9-3: 60 parts by mass, Example 9-4: 120 parts by mass, Example 9-5: 200 parts by mass, Example 9-6: 300 parts by mass) was prepared and used.

Each light emitting device was evaluated in the same manner as in Example 1-1. The results are shown in Table 3.

TABLE 3

| | Fluorescent material | Fluorescent material amount (parts by mass) | Luminous flux (lm) | Radiant flux (mW) | x | y | Dominant wavelength $\lambda d$ | Melanopic ratio | S/P ratio | Ib/Ia |
|---|---|---|---|---|---|---|---|---|---|---|
| Comparative Example 5-1 | Fluorescent material E | 20 | 12.2 | 122.8 | 0.161 | 0.082 | 466 | 4.85 | 8.7 | 0.93 |
| Comparative Example 5-2 | | 40 | 16.7 | 121.3 | 0.166 | 0.121 | 471 | 3.56 | 6.6 | 0.89 |
| Example 5-3 | | 60 | 22.8 | 116.6 | 0.177 | 0.190 | 478 | 2.55 | 5.0 | 0.83 |
| Example 5-4 | | 90 | 22.4 | 118.4 | 0.176 | 0.181 | 478 | 2.63 | 5.2 | 0.83 |
| Example 5-5 | | 120 | 23.9 | 116.6 | 0.179 | 0.202 | 480 | 2.43 | 4.8 | 0.82 |
| Example 5-6 | | 200 | 27.9 | 109.2 | 0.192 | 0.273 | 486 | 1.95 | 4.1 | 0.76 |
| Example 5-7 | | 280 | 29.5 | 101.5 | 0.203 | 0.331 | 492 | 1.71 | 3.7 | 0.72 |
| Comparative Example 6-1 | Fluorescent material F | 20 | 8.7 | 123.1 | 0.156 | 0.056 | 462 | 6.79 | 11.8 | 0.96 |
| Comparative Example 6-2 | | 40 | 12.7 | 121.2 | 0.160 | 0.089 | 467 | 4.67 | 8.4 | 0.93 |
| Comparative Example 6-3 | | 60 | 15.2 | 118.9 | 0.163 | 0.112 | 471 | 3.88 | 7.2 | 0.90 |
| Comparative Example 6-4 | | 100 | 16.6 | 117.0 | 0.165 | 0.127 | 472 | 3.53 | 6.6 | 0.89 |
| Example 6-5 | | 200 | 20.5 | 108.7 | 0.173 | 0.182 | 478 | 2.70 | 5.3 | 0.84 |
| Example 6-6 | | 300 | 22.6 | 98.9 | 0.182 | 0.237 | 483 | 2.23 | 4.5 | 0.80 |
| Example 6-7 | | 400 | 23.5 | 92.8 | 0.188 | 0.274 | 486 | 2.03 | 4.2 | 0.77 |
| Example 6-8 | | 450 | 23.3 | 88.8 | 0.191 | 0.289 | 488 | 1.95 | 4.1 | 0.76 |
| Example 6-9 | | 550 | 23.7 | 85.4 | 0.196 | 0.312 | 490 | 1.84 | 3.9 | 0.74 |
| Comparative Example 7-1 | Fluorescent material G | 20 | 6.8 | 122.9 | 0.155 | 0.043 | 459 | 8.54 | 14.6 | 0.98 |
| Comparative Example 7-2 | | 40 | 9.9 | 120.7 | 0.157 | 0.067 | 464 | 5.92 | 10.4 | 0.95 |
| Comparative Example 7-3 | | 60 | 12.4 | 116.5 | 0.159 | 0.090 | 468 | 4.67 | 8.4 | 0.93 |
| Comparative Example 7-4 | | 150 | 15.6 | 109.4 | 0.164 | 0.129 | 473 | 3.55 | 6.6 | 0.89 |
| Example 7-5 | | 250 | 16.9 | 103.3 | 0.167 | 0.153 | 475 | 3.13 | 6.0 | 0.87 |
| Example 7-6 | | 350 | 18.7 | 92.5 | 0.174 | 0.201 | 480 | 2.57 | 5.1 | 0.83 |
| Example 7-7 | | 450 | 19.0 | 86.8 | 0.179 | 0.224 | 482 | 2.38 | 4.8 | 0.81 |
| Example 7-8 | | 560 | 19.0 | 82.1 | 0.182 | 0.243 | 484 | 2.24 | 4.5 | 0.79 |
| Example 7-9 | | 600 | 18.7 | 77.6 | 0.184 | 0.256 | 485 | 2.16 | 4.4 | 0.78 |
| Example 7-10 | | 650 | 18.1 | 74.3 | 0.185 | 0.262 | 485 | 2.13 | 4.4 | 0.78 |
| Example 7-11 | | 700 | 17.9 | 74.1 | 0.185 | 0.258 | 485 | 2.15 | 4.4 | 0.78 |
| Comparative Example 8-1 | Fluorescent material H | 20 | 8.8 | 123.5 | 0.157 | 0.057 | 462 | 6.72 | 11.7 | 0.96 |
| Comparative Example 8-2 | | 40 | 14.3 | 121.9 | 0.162 | 0.101 | 469 | 4.18 | 7.6 | 0.91 |
| Comparative Example 8-3 | | 60 | 16.3 | 119.5 | 0.164 | 0.121 | 472 | 3.66 | 6.8 | 0.89 |
| Comparative Example 8-4 | | 100 | 17.9 | 118.9 | 0.166 | 0.137 | 473 | 3.32 | 6.3 | 0.88 |
| Example 8-5 | | 200 | 23.5 | 110.8 | 0.177 | 0.214 | 481 | 2.41 | 4.8 | 0.82 |
| Example 8-6 | | 300 | 25.3 | 104.3 | 0.183 | 0.258 | 485 | 2.12 | 4.4 | 0.79 |
| Example 8-7 | | 400 | 26.7 | 99.3 | 0.190 | 0.301 | 489 | 1.92 | 4.0 | 0.76 |
| Example 8-8 | | 450 | 27.4 | 97.1 | 0.194 | 0.322 | 491 | 1.83 | 3.9 | 0.74 |

TABLE 3-continued

|  | Fluorescent material | Fluorescent material amount (parts by mass) | Luminous flux (lm) | Radiant flux (mW) | x | y | Dominant wavelength λd | Melanopic ratio | S/P ratio | Ib/Ia |
|---|---|---|---|---|---|---|---|---|---|---|
| Comparative Example 9-1 | Fluorescent material I | 20 | 13.5 | 122.8 | 0.163 | 0.093 | 468 | 4.38 | 8.0 | 0.92 |
| Comparative Example 9-2 |  | 40 | 18.3 | 121.7 | 0.169 | 0.135 | 473 | 3.28 | 6.2 | 0.87 |
| Example 9-3 |  | 60 | 21.9 | 120.4 | 0.175 | 0.172 | 477 | 2.72 | 5.3 | 0.84 |
| Example 9-4 |  | 120 | 24.7 | 119.4 | 0.180 | 0.204 | 480 | 2.41 | 4.8 | 0.81 |
| Example 9-5 |  | 200 | 28.6 | 114.4 | 0.191 | 0.265 | 485 | 1.99 | 4.1 | 0.77 |
| Example 9-6 |  | 300 | 31.9 | 105.5 | 0.207 | 0.351 | 493 | 1.63 | 3.6 | 0.71 |

The light emitting device of each Example emitted light having a dominant wavelength in the range of 475 nm or more and 500 nm or less, and the S/P ratio, which was the ratio of a luminous flux in scotopic vision relative to a luminous flux in photopic vision, was 6.5 or less. It is considered that the light emitting device of each Example reduces the difference between the luminous flux in a dark place and the luminous flux in a bright place even when emitting light having a dominant wavelength in the wavelength range from blue to green including bluish-green, so that the light can be brightly seen in both scotopic vision and photopic vision while maintaining excellent visibility, and the difference in brightness perceived by humans can be reduced.

The light emitting device of each Example emitted light having a dominant wavelength in the range of 475 nm or more and 500 nm or less, and the melanopic ratio was 3.4 or less. It is considered that the light emitting device of each Example is less likely to have a significant effect on human circadian rhythms, and is able to emit light having a dominant wavelength in the wavelength range from blue to green including bluish-green, which is capable of reminding a specific behavior by a signal color representing a specific state of the apparatus such as charging.

The light having a dominant wavelength in the range of 475 nm or more and 500 nm or less emitted from the light emitting device of each Example exhibited a light emission color within the area A1 shown in FIG. 3 and the area A2 shown in FIG. 4, in the xy chromaticity coordinate system of the CIE 1931 chromaticity diagram. The light emitted from the light emitting device of each of Example 5-5, Example 5-6, Examples 6-6 to 6-9, Examples 7-7 to 7-11, Examples 8-5 to 8-8, and Example 9-5 exhibited a blue to bluish-green light emission color within the area A3 shown in FIG. 5 among the areas A1 and A2.

The integrated value ratio Ib/Ia in the light emitting device of each Example was in the range of 0.6 or more and 0.95 or less. It is considered that the light emitting device of each Example is able to emit light which is bright in both scotopic vision and photopic vision while maintaining excellent visibility, in which the difference in brightness perceived by humans can be reduced in both scotopic vision and photopic vision.

The light emitting device of each of Comparative Examples 5-1 to 5-2, Comparative Examples 6-1 to 6-4, Comparative Examples 7-1 to 7-4, Comparative Examples 8-1 to 8-3, and Comparative Example 9-1 had a relatively large molar ratio of Ga and a small molar ratio of Ce in each composition of the rare earth aluminate fluorescent materials E to I contained in the wavelength conversion member, and thus the luminance was low. Since the content of each of the rare earth aluminate fluorescent materials E to I is small, light having a dominant wavelength of less than 475 nm was emitted, and the S/P ratio was more than 6.5. It is assumed that the light may be perceived as too bright when viewed in a dark place. Further, the light emitting device of each of Comparative Examples 5-1 to 5-2, Comparative Examples 6-1 to 6-4, Comparative Examples 7-1 to 7-4, Comparative Examples 8-1 to 8-3, and Comparative Example 9-1 emitted light having a dominant wavelength of less than 475 nm, and the melanopic ratio was more than 3.4. It may affect human circadian rhythms. The light emitting device of each of Comparative Example 8-4 and Comparative Example 9-2 had a relatively large molar ratio of Ga in each composition of the rare earth aluminate fluorescent materials H or I contained in the wavelength conversion member, and thus the light emission peak wavelength of the rare earth aluminate fluorescent material H or I was shifted compared to the fluorescent material having a small molar ratio of Ga. Accordingly, the light having a dominant wavelength in the range of 475 nm or more and 500 nm or less was not emitted since the content of the rare earth aluminate fluorescent material H or I was small.

Example 10-1 and Comparative Examples 10-2 to 10-3

The light emitting device of the embodiment shown in FIGS. 6A and 6B was produced. In the step of arranging a light emitting element, a ceramic substrate made of aluminum nitride was used as the substrate. As the light emitting element, a light emitting element on which a nitride semiconductor layer having a dominant wavelength of 450 nm was laminated was used. The size of the light emitting element was a substantially square having a planar shape of about 1.0 mm square, and the thickness was about 0.11 mm. The light emitting element was arranged such that the light emitting surface was on the substrate side, and was flip-chip mounted by bumps using a conductive member made of Au. The semiconductor element was flip-chip mounted by bumps using a conductive member made of Au at an interval from the light emitting element.

In the step of forming a wavelength conversion member including a wavelength conversion body, the rare earth aluminate fluorescent material A was used. A composition for a wavelength conversion body containing the rare earth aluminate fluorescent material A in an amount shown in Table 4 (Example 10-T 100 parts by mass, Comparative Example 10-2: 150 parts by mass, Comparative Example 10-3: 200 parts by mass) relative to 100 parts by mass of a silicone resin serving as a translucent material, and containing 15 parts by mass of aluminum oxide serving as a filler was prepared. As the translucent body, a translucent body made of borosilicate glass, in which the shape was a substantially square having a planar shape of about 1.15 mm square, which was about 0.15 mm larger in length and width than the planar shape of the light emitting element, and the thickness was about 0.10 mm, was prepared. The composition for a wavelength conversion body was printed on one surface of the translucent body having a substantially square shape by a printing method, and was cured by heating at 180° C. for 2 hours to form a layered wavelength conversion body having a thickness of about 80 μm, thereby forming a wavelength conversion member in which the layered or plate-shaped wavelength conversion body and the translucent body were integrated.

In the step of adhering the light emitting element and the wavelength conversion member, one surface of the wavelength conversion member having a substantially square with a plane shape of about 1.15 mm square and one surface of the light emitting element having a substantially square with a plane shape of about 1.0 mm square were adhered together using an adhesive containing a silicone resin, thereby forming an adhesive layer between the light emitting element and the wavelength conversion member.

In the step of forming a covering member, a composition for a coating member containing a dimethyl silicone resin and titanium oxide particles having an average particle diameter of 0.28 μm (catalog value), in which the amount of the titanium oxide particles was 30 parts by mass relative to 100 parts by mass of the dimethyl silicone resin, was prepared. The composition for a coating member was filled such that the light emitting element arranged on the substrate and the side surfaces of the wavelength conversion member including the wavelength conversion body and the translucent body were covered with the composition for a coating member, and the semiconductor element was completely embedded in the composition for a coating member. The composition for a covering member was cured to form a covering member and a resin package, thereby producing a light emitting device.

Examples 11-1 to 11-2 and Comparative Example 11-3

The rare earth aluminate fluorescent material A and the rare earth aluminate fluorescent material H were mixed at a weight ratio of 50:50 to produce a light emitting device. A light emitting device was produced in the same manner as in Example 10-1 except that a composition for a wavelength conversion body containing the mixture of the rare earth aluminate fluorescent material A and the rare earth aluminate fluorescent material H in an amount shown in Table 4 (Example 11-1: 200 parts by mass, Example 11-2: 300 parts by mass, Comparative Example 11-3: 500 parts by mass) was prepared and used.

Examples 12-1 to 12-3

The rare earth aluminate fluorescent material H was used to produce a light emitting device. A light emitting device was produced in the same manner as in Example 10-1 except that a composition for a wavelength conversion body containing the rare earth aluminate fluorescent material H in an amount shown in Table 4 (Example 12-1: 400 parts by mass, Example 12-2: 500 parts by mass, Example 12-3: 600 parts by mass) was prepared and used.

TABLE 4

| | Fluorescent material | Fluorescent material amount (parts by mass) | Luminous flux (lm) | Radiant flux (mW) | x | y | Dominant wavelength $\lambda_d$ | Melanopic ratio | S/P ratio | lb/la |
|---|---|---|---|---|---|---|---|---|---|---|
| Example 10-1 | Fluorescent material A | 100 | 310.1 | 1086 | 0.229 | 0.300 | 488 | 1.4 | 3.1 | 0.68 |
| Comparative Example 10-2 | | 150 | 369.9 | 1064 | 0.255 | 0.397 | 503 | 1.2 | 2.7 | 0.60 |
| Comparative Example 10-3 | | 200 | 380.2 | 1084 | 0.256 | 0.402 | 504 | 1.1 | 2.7 | 0.60 |
| Example 11-1 | Fluorescent material A + H | 200 | 326.2 | 1096 | 0.227 | 0.319 | 490 | 1.4 | 3.2 | 0.67 |
| Example 11-2 | | 300 | 355.6 | 1052 | 0.243 | 0.386 | 499 | 1.3 | 2.9 | 0.62 |
| Comparative Example 11-3 | | 500 | 378.8 | 1038 | 0.255 | 0.434 | 510 | 1.2 | 2.7 | 0.59 |
| Example 12-1 | Fluorescent material H | 400 | 214.3 | 1083 | 0.175 | 0.191 | 479 | 2.5 | 4.9 | 0.83 |
| Example 12-2 | | 500 | 227.4 | 1071 | 0.177 | 0.210 | 481 | 2.3 | 4.7 | 0.82 |
| Example 12-3 | | 600 | 228.7 | 1041 | 0.178 | 0.220 | 482 | 2.3 | 4.6 | 0.81 |

The light emitting device of each Example emitted light having a dominant wavelength in the range of 475 nm or more and 500 nm or less, and the S/P ratio, which was the ratio of a luminous flux in scotopic vision relative to a luminous flux in photopic vision, was 6.5 or less. It is considered that the light emitting device of each Example reduces the difference between the luminous flux in a dark place and the luminous flux in a bright place even when emitting light having a dominant wavelength in the wavelength range from blue to green including bluish-green, so that the light can be brightly seen in both scotopic vision and photopic vision while maintaining excellent visibility, and the difference in brightness perceived by humans can be reduced.

The light emitting device of each Example emitted light having a dominant wavelength in the range of 475 nm or more and 500 nm or less, and the melanopic ratio was 3.4 or less. It is considered that the light emitting device of each Example is less likely to have a significant effect on human circadian rhythms, and emits light having a dominant wavelength in the wavelength range from blue to green including bluish-green, which is capable of reminding a specific behavior by a signal color representing a specific state of the apparatus such as charging.

The light having a dominant wavelength in the range of 475 nm or more and 500 nm or less emitted from the light emitting device of each Example exhibited a light emission color within the area A1 shown in FIG. 3 and the area A2 shown in FIG. 4, in the xy chromaticity coordinate system of the CIE 1931 chromaticity diagram. The light emitted from the light emitting device of Example 12-3 exhibited a blue to bluish-green light emission color within the area A3 shown in FIG. 5 among the areas A1 and A2.

The integrated value ratio Ib/Ia in the light emitting device of each Example was in the range of 0.6 or more and 0.95 or less. It is considered that the light emitting device of each Example is able to emit light which is bright in both scotopic vision and photopic vision while maintaining excellent visibility, in which the difference in brightness perceived by humans can be reduced in both scotopic vision and photopic vision.

The light emitting device of each of Comparative Examples 10-2 to 10-3 and Comparative Example 11-3 emitted light having a dominant wavelength of more than 500 nm and did not emit light having a dominant wavelength in the range of 475 nm or more and 500 nm or less, since the luminance of the rare earth aluminate fluorescent material A contained in the wavelength conversion member was high and the content of the rare earth aluminate fluorescent material was too large.

The light emitting device according to the embodiment of the present disclosure can be utilized as a light emitting device for general illumination, a light emitting device for vehicles, a display device, an illumination fixture, a display.

The invention claimed is:

1. A light emitting device, comprising
a light emitting element having a dominant wavelength in a range of 400 nm or more and 500 nm or less, and
a wavelength conversion member that is arranged on a light emitting side of the light emitting element and includes a rare earth aluminate fluorescent material having a composition represented by the following formula (I):

$$(Lu_{1-p-n}Ln_pCe_n)_3(Al_{1-m}Ga_m)_{5k}O_{12} \quad (I)$$

wherein in the formula (I), Ln represents at least one rare earth element selected from the group consisting of Y, La, Gd, and Tb, and the parameters k, m, n, and p satisfy $0.95 \leq k \leq 1.05$, $0.05 \leq m \leq 0.70$, $0.002 \leq n \leq 0.050$, and $0 \leq p \leq 0.30$, respectively,
wherein the light emitting device emits light having a dominant wavelength in a range of 475 nm or more and 500 nm or less, and
wherein the light emitting device emits light having an S/P ratio of 6.5 or less derived from the following formula (1), which is the ratio of a luminous flux in scotopic vision relative to a luminous flux in photopic vision:

$$S/P \text{ ratio} = \frac{K' \int_{360}^{830} V'(\lambda)\phi_e(\lambda)d\lambda}{K \int_{360}^{830} V(\lambda)\phi_e(\lambda)d\lambda} \quad (1)$$

wherein in the formula (1), K is 6,831 (lm/W), K' is 1,700 (lm/W), and in a range where the wavelength λ, is 360 nm or more and 830 nm or less, V (λ) refers to a photopic standard spectral luminous efficiency of humans, V'(λ) refers to a scotopic standard spectral luminous efficiency of humans, and $\Phi_e(\lambda)$ refers to a spectral total radiant flux of the light emitted from the light emitting device
wherein the light emitting device emits light having chromaticity coordinates (x, y) within an area A2 in the xy chromaticity coordinate system of the CIE 1931 chromaticity diagram, wherein when the chromaticity coordinates (x=0.0350, y=0.4127) is defined as a first point, the chromaticity coordinates (x=0.0800, y=0.2149) is defined as a second point, the chromaticity coordinates (x=0.2150, y=0.2106) is defined as a third point, and the chromaticity coordinates (x=0.2550, y=0.3550) is defined as a fourth point, the area A2 is demarcated by a first straight line connecting the first point and the second point, a second straight line connecting the second point and the third point, a third straight line connecting the third point and the fourth point, and a fourth straight line connecting the fourth point and the first point.

2. A light emitting device, comprising
a light emitting element having a dominant wavelength in a range of 400 nm or more and 500 nm or less, and
a wavelength conversion member that is arranged on a light emitting side of the light emitting element and includes a rare earth aluminate fluorescent material having a composition represented by the following formula (I):

$$(Lu_{1-p-n}Ln_pCe_n)_3(Al_{1-m}Ga_m)_{5k}O_{12} \quad (I)$$

wherein in the formula (I), Ln represents at least one rare earth element selected from the group consisting of Y, La, Gd, and Tb, and the parameters k, m, n, and p satisfy $0.95 \leq k \leq 1.05$, $0.05 \leq m \leq 0.70$, $0.002 \leq n \leq 0.050$, and $0 \leq p \leq 0.30$ respectively,
wherein the light emitting device emits light having a dominant wavelength in a range of 475 nm or more and 500 nm or less, and
wherein the light emitting device emits light having a melanopic ratio of 3.4 or less derived from the following formula (2):

$$\text{Melanopic ratio} = \frac{\int_{380}^{730} \text{Lamp} \times \text{Circadian}}{\int_{380}^{730} \text{Lamp} \times \text{Visual}} \times 1.218 \quad (2)$$

wherein in the formula (2), in a range where the wavelength is 380 nm or more and 730 nm or less, "Lamp" refers to a spectral distribution of the light emitting device, "Circadian" refers to a sensitivity curve of an intrinsically photosensitive retinal ganglion cell that is a photoreceptor in the mammalian retina, "Visual" refers to a visual sensitivity curve in human photopic vision, "Lamp×Circadian" refers to a circadian response included in the spectral distribution of the light emitting device, "Lamp×Visual" refers to a visual sensitivity response included in the spectral distribution of the light emitting device, and "1.218" is a constant (lux factor)
wherein the light emitting device emits light having chromaticity coordinates (x, y) within an area A2 in the xy chromaticity coordinate system of the CIE 1931 chromaticity diagram, wherein when the chromaticity coordinates (x=0.0350, y=0.4127) is defined as a first point, the chromaticity coordinates (x=0.0800, y=0.2149) is defined as a second point, the chromaticity coordinates (x=0.2150, y=0.2106) is defined as a third point, and the chromaticity coordinates (x=0.2550, y=0.3550) is defined as a fourth point, the area A2 is demarcated by a first straight line connecting the first point and the second point, a second straight line connecting the second point and the third point, a third straight line connecting the third point and the fourth point, and a fourth straight line connecting the fourth point and the first point.

3. The light emitting device according to claim 1, wherein the S/P ratio is 6.0 or less.

4. The light emitting device according to claim 1, wherein the S/P ratio is 3.0 or more.

5. The light emitting device according to claim 2, wherein the melanopic ratio is 1.4 or more.

6. The light emitting device according to claim 1, wherein in a light emission spectrum of the light emitting device, an integrated value ratio Ib/Ia of an integrated value Ib of the light emission spectrum in a wavelength range of 380 nm or more and 531 nm or less relative to an integrated value Ia of the light emission spectrum in a wavelength range of 380 nm or more and 780 nm or less is in a range of 0.6 or more and 0.95 or less.

7. The light emitting device according to claim 1, emitting light having chromaticity coordinates (x, y) within an area A3 in the xy chromaticity coordinate system of the CIE 1931 chromaticity diagram, wherein when the chromaticity coordinates (x=0.1825, y=0.3252) is defined as a first point, the chromaticity coordinates (x=0.1550, y=0.2149) is defined as a second point, the chromaticity coordinates (x=0.1930, y=0.2106) is defined as a third point, and the chromaticity coordinates (x=0.2205, y=0.3209) is defined as a fourth point, the area A3 is demarcated by a first straight line connecting the first point and the second point, a second straight line connecting the second point and the third point, a third straight line connecting the third point and the fourth point, and a fourth straight line connecting the fourth point and the first point.

8. The light emitting device according to claim 1, further comprising at least one fluorescent material selected from the group consisting of a halosilicate fluorescent material having a composition represented by the following formula (II), a β-SiAlON fluorescent material having a composition represented by the following formula (III), an oxynitride fluorescent material having a composition represented by the following formula (IV), an alkaline earth metal aluminate fluorescent material having a composition represented by the following formula (V), an alkaline earth metal sulfide fluorescent material having a composition represented by the following formula (VI), a first silicate fluorescent material having a composition represented by the following formula (VII), a second silicate fluorescent material having a composition represented by the following formula (VIII), a third silicate fluorescent material or germanate fluorescent material having a composition represented by the following formula (IX), and a fourth silicate fluorescent material having a composition represented by the following formula (X):

$(Ca,Sr,Ba)_8MgSi_4O_{16}(F,Cl,Br)_2$:Eu  (II), $Si_{6-z}Al_zO_zN_{8-z}$:Eu  (III), wherein $0<z\leq 4.2$, $BaSi_2O_2N_2$:Eu  (IV), $Sr_4Al_{14}O_{25}$:Eu  (V), $(Sr,Ca,Ba)Ga_2S_4$:Eu  (VI), $(Ba,Sr,Ca)_2SiO_4$:Eu  (VII), $(Ba,Sr)ZrSi_3O_9$:Eu  (VIII), $Ca_3Sc_2(Si,Ge)_3O_{12}$:Ce  (IX), and $(ALi_3SiO_4)n$:Eu  (X), wherein A represents at least one element selected from the group consisting of Li, Na, K, Rb, and Cs, and n is an integer of 1 to 8.

9. The light emitting device according to claim 1, wherein the parameters k, m, n, and p in the formula (I) satisfy $0.95\leq k\leq 1.05$, $0.3\leq m\leq 0.5$, $0.002\leq n\leq 0.04$, and $0\leq p\leq 0.20$, respectively.

10. The light emitting device according to claim 2, wherein the melanopic ratio is 1.4 or more.

11. The light emitting device according to claim 2, wherein in a light emission spectrum of the light emitting device, an integrated value ratio Ib/Ia of an integrated value Ib of the light emission spectrum in a wavelength range of 380 nm or more and 531 nm or less relative to an integrated value Ia of the light emission spectrum in a wavelength range of 380 nm or more and 780 nm or less is in a range of 0.6 or more and 0.95 or less.

12. The light emitting device according to claim 2, emitting light having chromaticity coordinates (x, y) within an area A3 in the xy chromaticity coordinate system of the CIE 1931 chromaticity diagram, wherein when the chromaticity coordinates (x=0.1825, y=0.3252) is defined as a first point, the chromaticity coordinates (x=0.1550, y=0.2149) is defined as a second point, the chromaticity coordinates (x=0.1930, y=0.2106) is defined as a third point, and the chromaticity coordinates (x=0.2205, y=0.3209) is defined as a fourth point, the area A3 is demarcated by a first straight line connecting the first point and the second point, a second straight line connecting the second point and the third point, a third straight line connecting the third point and the fourth point, and a fourth straight line connecting the fourth point and the first point.

13. The light emitting device according to claim 2, further comprising at least one fluorescent material selected from the group consisting of a halosilicate fluorescent material having a composition represented by the following formula (II), a β-SiAlON fluorescent material having a composition represented by the following formula (III), an oxynitride fluorescent material having a composition represented by the following formula (IV), an alkaline earth metal aluminate fluorescent material having a composition represented by the following formula (V), an alkaline earth metal sulfide fluorescent material having a composition represented by the following formula (VI), a first silicate fluorescent material having a composition represented by the following formula (VII), a second silicate fluorescent material having a composition represented by the following formula (VIII), a third silicate fluorescent material or germanate fluorescent material having a composition represented by the following formula (IX), and a fourth silicate fluorescent material having a composition represented by the following formula (X):

$(Ca,Sr,Ba)_8MgSi_4O_{16}(F,Cl,Br)_2$:Eu  (II), $Si_{6-z}Al_zO_zN_{8-z}$:Eu  (III), wherein $0<z\leq 4.2$, $BaSi_2O_2N_2$:Eu  (IV), $Sr_4Al_{14}O_{25}$:Eu  (V), $(Sr,Ca,Ba)Ga_2S_4$:Eu  (VI), $(Ba,Sr,Ca)_2SiO_4$:Eu  (VII), $(Ba,Sr)ZrSi_3O_9$:Eu  (VIII), $Ca_3Sc_2(Si,Ge)_3O_{12}$:Ce (IX), and $(ALi_3SiO_4)n$:Eu (X), wherein A represents at least one element selected from the group consisting of Li, Na, K, Rb, and Cs, and n is an integer of 1 to 8.

14. The light emitting device according to claim 2, wherein the parameters k, m, n, and p in the formula (I) satisfy $0.95 \leq k \leq 1.05$, $0.3 \leq m \leq 0.5$, $0.002 \leq n \leq 0.04$, and $0 \leq p \leq 0.20$, respectively.

\* \* \* \* \*